United States Patent
Dehara et al.

(10) Patent No.: US 11,881,838 B2
(45) Date of Patent: Jan. 23, 2024

(54) RESONANCE DEVICE AND MANUFACTURING METHOD OF RESONANCE DEVICE

(71) Applicant: Murata Manufacturing Co., Ltd., Nagaokakyo (JP)

(72) Inventors: Kentarou Dehara, Nagaokakyo (JP); Masakazu Fukumitsu, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 595 days.

(21) Appl. No.: 17/162,163

(22) Filed: Jan. 29, 2021

(65) Prior Publication Data
US 2021/0152148 A1 May 20, 2021

Related U.S. Application Data

(63) Continuation of application No. PCT/JP2019/021055, filed on May 28, 2019.

(30) Foreign Application Priority Data

Sep. 28, 2018 (JP) ................. 2018-183656

(51) Int. Cl.
*H03H 9/10* (2006.01)
*B81B 7/00* (2006.01)
*H03H 3/007* (2006.01)
*H03H 9/24* (2006.01)

(52) U.S. Cl.
CPC ......... *H03H 9/1057* (2013.01); *B81B 7/0038* (2013.01); *H03H 3/0072* (2013.01); *H03H 9/2457* (2013.01); *B81B 2201/0271* (2013.01); *B81B 2203/0118* (2013.01)

(58) Field of Classification Search
CPC ........................ H03H 9/1057; H03H 9/2457
USPC ..................................................... 310/363
See application file for complete search history.

(56) References Cited

U.S. PATENT DOCUMENTS

2018/0127268 A1  5/2018 Fukumitsu et al.
2020/0391999 A1* 12/2020 Fukumitsu ............. B81C 3/001

FOREIGN PATENT DOCUMENTS

| JP | 2013052449 A | 3/2013 |
| JP | 2013248657 A | 3/2013 |
| JP | 2016041434 A | 3/2016 |
| WO | 2017047663 A1 | 3/2017 |

OTHER PUBLICATIONS

International Search Report issued for PCT/JP2019/021055, dated Jul. 30, 2019.
Written Opinion of the International Searching Authority issued for PCT/JP2019/0126405, dated Jul. 30, 2019.

* cited by examiner

*Primary Examiner* — Derek J Rosenau
(74) *Attorney, Agent, or Firm* — ArentFox Schiff LLP

(57) ABSTRACT

A resonance device that includes a MEMS substrate including a resonator, an upper lid, and a bonding portion bonding the MEMS substrate and the upper lid to seal a vibration space of the resonator. The bonding portion includes a eutectic layer containing a eutectic alloy as a main component thereof. The eutectic alloy is composed of a first metal containing aluminum as a main component thereof, a second metal of germanium or silicon, and a third metal of titanium or nickel.

19 Claims, 14 Drawing Sheets

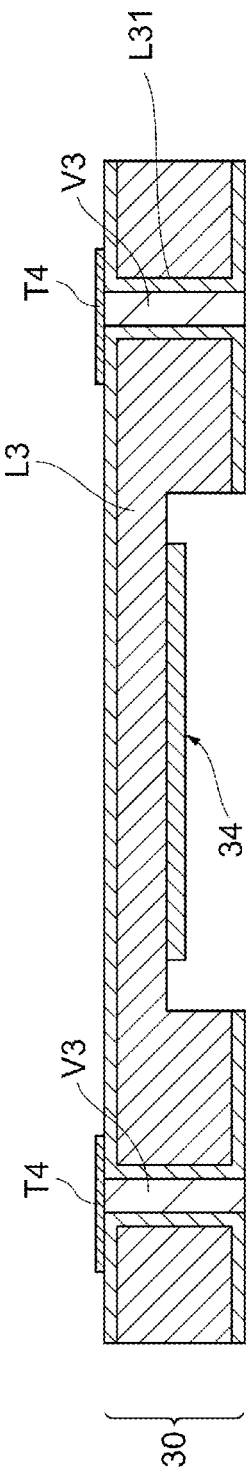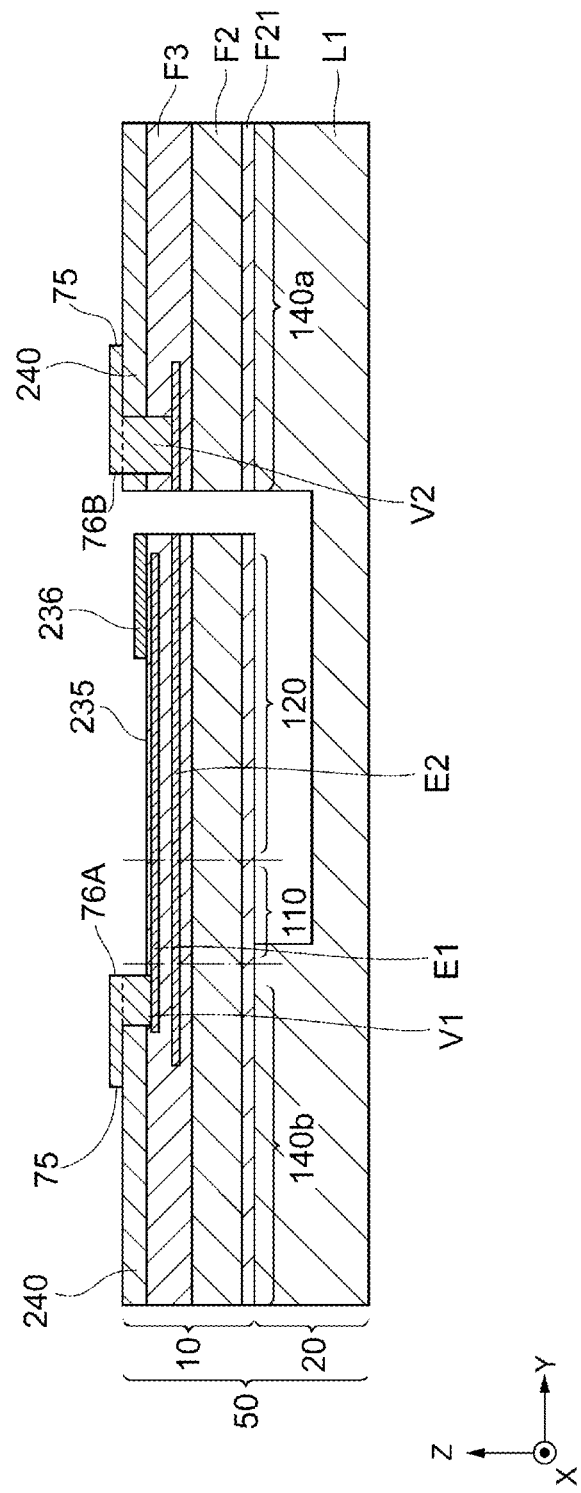
FIG. 8

RESONANCE DEVICE AND MANUFACTURING METHOD OF RESONANCE DEVICE

CROSS REFERENCE TO RELATED APPLICATIONS

The present application is a continuation of International application No. PCT/JP2019/021055, filed May 28, 2019, which claims priority to Japanese Patent Application No. 2018-183656, filed Sep. 28, 2018, the entire contents of each of which are incorporated herein by reference.

FIELD OF THE INVENTION

The present invention relates to a resonance device and a manufacturing method of a resonance device.

BACKGROUND OF THE INVENTION

Resonance devices manufactured using micro electro mechanical systems (MEMS) technique have widely been used. The devices are formed by bonding an upper substrate to a lower substrate including a resonator, for example.

For example, Patent Document 1 discloses a MEMS device including a lower substrate including a resonator, an upper substrate provided to face an element, and a bonding portion configured to bond the lower substrate and the upper substrate to each other at a circumference of the element. The bonding portion includes a region including a hypereutectic alloy and a region including a eutectic alloy. Covering the eutectic alloy with the hypereutectic alloy prevents a metal from splashing from a bonding surface of a eutectic bonding in the MEMS device.

Patent Document 1: International Publication No. 2017/047663

SUMMARY OF THE INVENTION

When two elements, for example, aluminum (Al) and germanium (Ge) are bonded in a eutectic-bonding manner, an aluminum-germanium alloy (AlGe alloy) is hardly formed and an aluminum (Al) monolayer and a germanium (Ge) monolayer are formed. As a result, a large number of interfaces between the aluminum (Al) monolayer and the germanium (Ge) monolayer are present. At the interfaces of the different materials, voids or separation (interfacial separation) is likely to occur because of a difference in thermal stresses, and airtightness and bonding strength of a bonding portion are deteriorated in some cases.

The present invention has been made in view of the above circumstances, and an object of the present invention is to provide a resonance device and a manufacturing method of a resonance device capable of improving the airtightness and the bonding strength of the bonding portion.

A resonance device according to an aspect of the present invention includes a first substrate including a resonator; a second substrate; and a bonding portion bonding the first substrate and the second substrate to each other to seal a vibration space of the resonator. The bonding portion includes a eutectic layer containing a eutectic alloy as a main component thereof. The eutectic alloy is composed of a first metal containing aluminum as a main component thereof, a second metal of germanium or silicon, and a third metal of titanium or nickel.

A method of manufacturing a resonance device according to another aspect of the present invention includes forming a first layer including a first metal layer of a first metal containing aluminum as a main component thereof around a vibration portion of a resonator in a first substrate; forming a second layer including a second metal layer of a second metal of germanium or silicon and a third metal layer of a third metal of titanium or nickel that extend continuously from a side of the second substrate, at a position facing the first metal layer in the first substrate when the first substrate and the second substrate face each other; and forming a bonding portion including a eutectic layer containing a eutectic alloy of the first metal, the second metal, and the third metal as a main component thereof so as to bond the first substrate and the second substrate to seal a vibration space of the resonator.

According to the present invention, it is possible to improve the airtightness and the bonding strength of the bonding portion.

BRIEF DESCRIPTION OF THE DRAWINGS

FIG. 8 is a sectional view of a process described in FIG. 7.

DETAILED DESCRIPTION OF THE PREFERRED EMBODIMENTS

Hereinafter, embodiments of the present invention will be described. In the following description of the drawings, the same or similar components are denoted by the same or similar reference symbols. The drawings are illustrative, and the dimensions and shapes of the respective parts are schematic and should not be construed as limiting the technical scope of the present invention to the embodiments.

Embodiment

Figure 1:
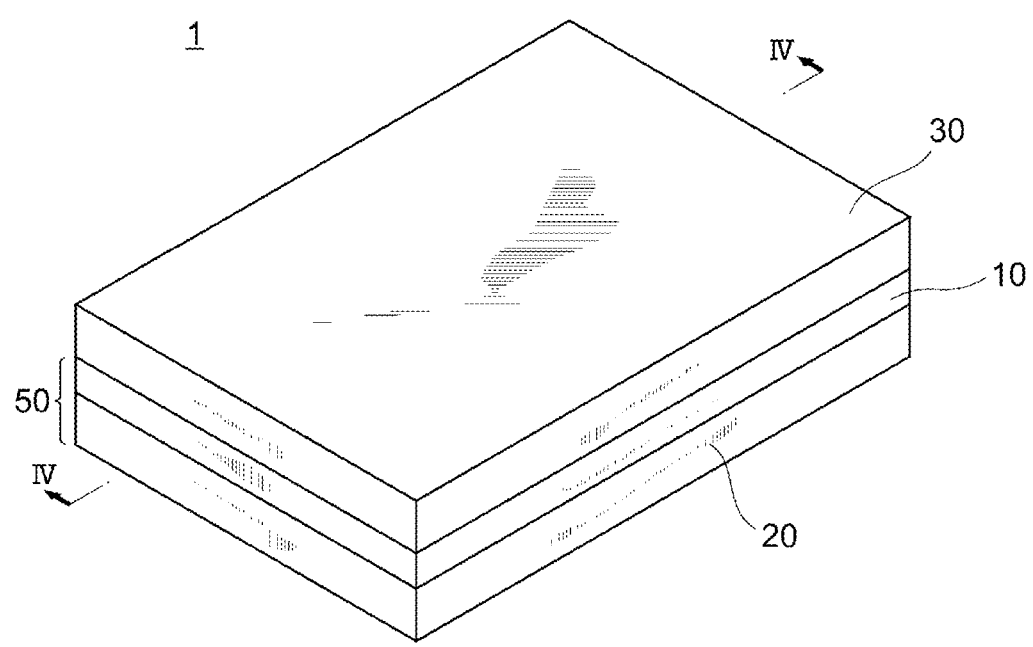
FIG. 1 is a perspective view of a resonance device according to an embodiment of the present invention schematically illustrating the appearance thereof.
Figure 2:
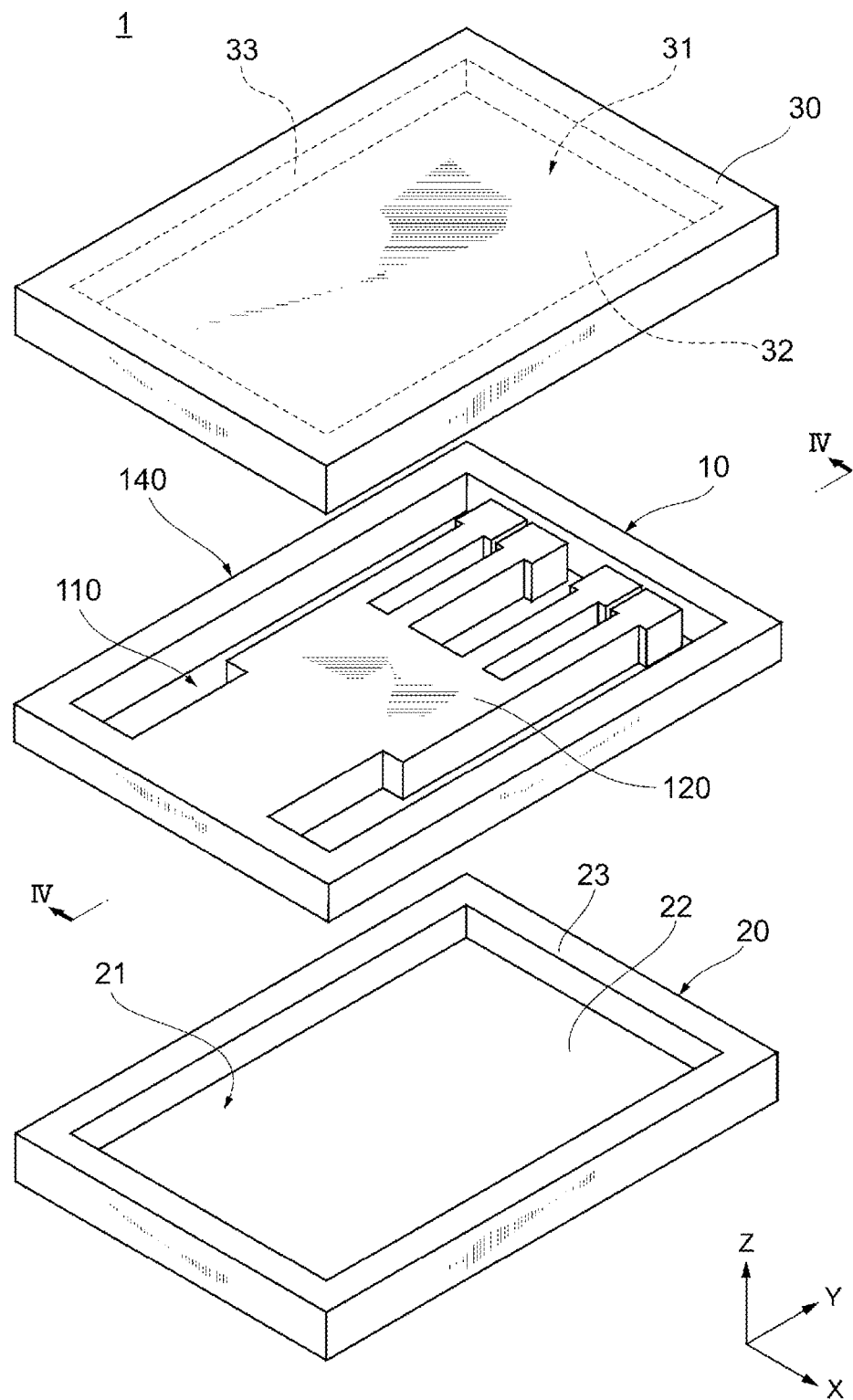
FIG. 2 is an exploded perspective view of the resonance device in FIG. 1 schematically illustrating the structure thereof.

First, a schematic configuration of a resonance device according to an embodiment of the present invention will be described with reference to FIG. 1 and FIG. 2. FIG. 1 is a perspective view of a resonance device 1 according to an embodiment of the present invention schematically illustrating the appearance thereof. FIG. 2 is an exploded perspective view of the resonance device 1 in FIG. 1 schematically illustrating the structure thereof.

The resonance device 1 includes a lower lid 20, a resonator 10 (hereinafter, lower lid 20 and resonator 10 are also collectively referred to as "MEMS substrate 50"), and an upper lid 30. That is, the resonance device 1 is configured by laminating the MEMS substrate 50, a bonding portion 60, and the upper lid 30 in this order. Note that the MEMS substrate 50 corresponds to an example of a "first substrate" of the present description, and the upper lid 30 corresponds to an example of a "second substrate" of the present description.

Hereinafter, each configuration of the resonance device 1 will be described. A side with the upper lid 30 of the resonance device 1 will be described as an upper side (or a front side), and a side with the lower lid 20 of the resonance device 1 will be described as a lower side (or a rear side) in the following description.

The resonator 10 is a MEMS vibrator manufactured using MEMS technique. The resonator 10 and the upper lid 30 are bonded to each other via the bonding portion 60, which will be described later. Further, the resonator 10 and the lower lid 20 are each formed using a silicon (Si) substrate (hereinafter referred to as "Si substrate"), and the Si substrates are bonded to each other. The MEMS substrate 50 (resonator 10 and lower lid 20) may be formed using an SOI substrate.

The upper lid 30 spreads in a plate-like shape along an XY plane, and a flat parallelepiped recess 31, for example, is formed on a rear surface of the upper lid 30. The recess 31 is surrounded by a side wall 33, and forms part of a vibration space in which the resonator 10 vibrates. Further, a getter layer 34, which will be described later, is formed on the surface of the recess 31 of the upper lid 30 on the side of the resonator 10. Note that the upper lid 30 may have a plate-like shape without having the recess 31.

The lower lid 20 includes a bottom plate 22 being provided along the XY plane and having a rectangular plate-like shape, and a side wall 23 extending from a peripheral edge portion of the bottom plate 22 in a Z axis direction, that is, in a lamination direction of the lower lid 20 and the resonator 10. A recess 21 is formed by the front surface of the bottom plate 22 and the inner surface of the side wall 23, on the surface of the lower lid 20 facing the resonator 10. The recess 21 forms part of the vibration space of the resonator 10. Note that the lower lid 20 may have a plate-like shape without having the recess 21. Further, a getter layer may be formed on the surface of the recess 21 of the lower lid 20 on the side of the resonator 10.

Figure 3:
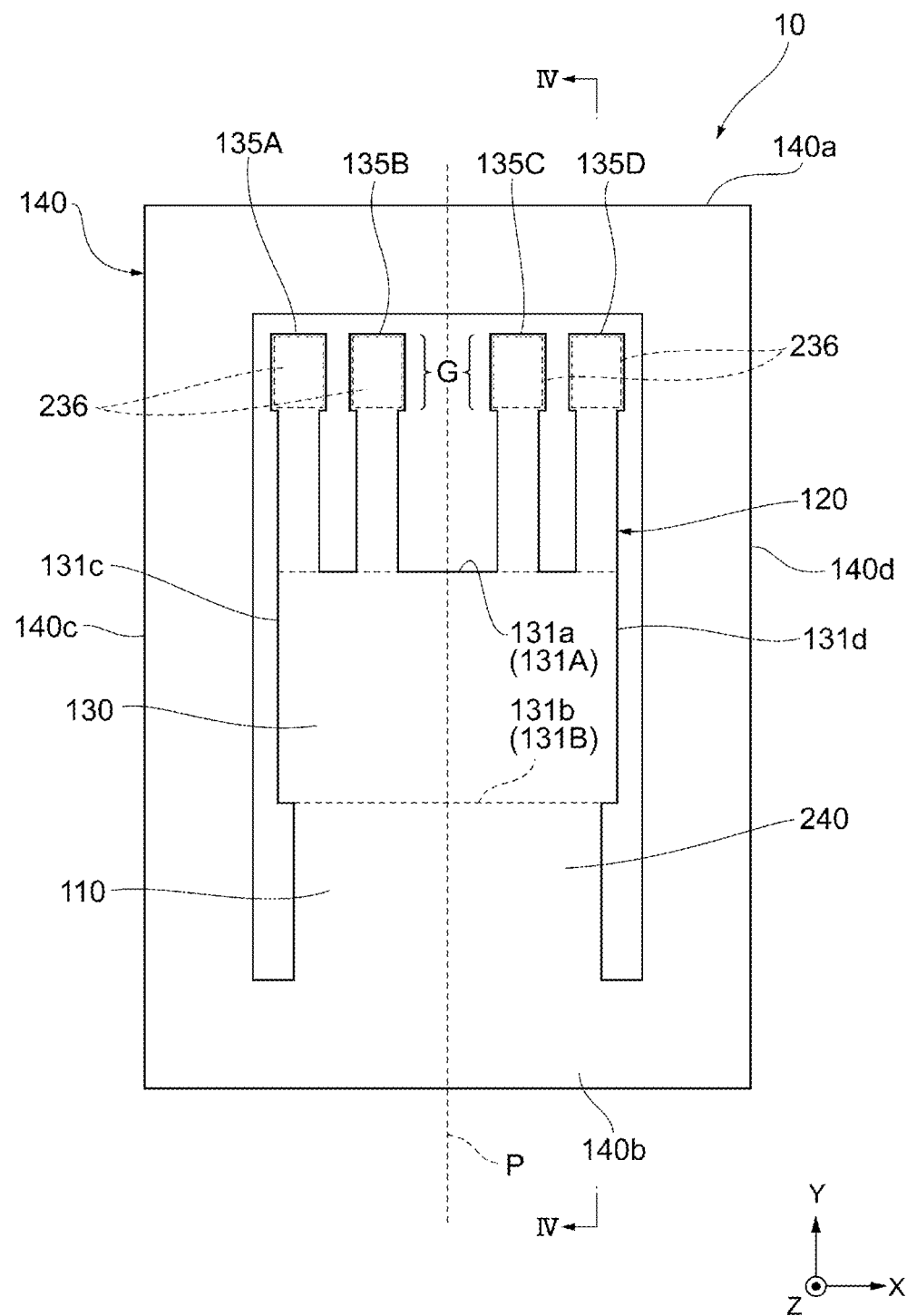
FIG. 3 is a plan view of a resonator in FIG. 2 schematically illustrating the structure thereof.

Next, a schematic configuration of the resonator 10 according to an embodiment of the present invention will be described with reference to FIG. 3. FIG. 3 is a plan view of the resonator 10 in FIG. 2 schematically illustrating the structure thereof.

The resonator 10 is a MEMS vibrator manufactured using MEMS technique as illustrated in FIG. 3, and performs out-of-plane vibration in the XY plane in an orthogonal coordinate system in FIG. 3. Note that the resonator 10 is not limited to a resonator using an out-of-plane bending vibration mode. The resonator of the resonance device 1 may employ a spreading vibration mode, a thickness longitudinal vibration mode, a lamb wave vibration mode, an in-plane bending vibration mode, and a surface acoustic wave vibration mode, for example. These vibrators are applied to timing devices, RF filters, duplexers, ultrasonic transducers, gyro sensors, acceleration sensors, or the like, for example. Further, the vibrators may be used in piezoelectric mirrors having an actuator function, piezoelectric gyros, piezoelectric microphones having a pressure sensor function, ultrasonic vibration sensors, or the like. Further, the vibrators may be applied to electrostatic MEMS elements, electromagnetic driving MEMS elements, and piezoresistive MEMS elements.

The resonator 10 includes a vibration portion 120, a holding portion 140, and a holding arm 110.

The holding portion 140 is formed in a rectangular frame shape so as to surround the outer side portion of the vibration portion 120 along the XY plane. For example, the holding portion 140 is integrally formed from a prismatic shaped frame body. Note that the holding portion 140 is preferably provided to at least part of the periphery of the vibration portion 120, and is not limited to a frame shape.

The holding arm 110 is provided inside the holding portion 140, and connects the vibration portion 120 and the holding portion 140 to each other.

The vibration portion 120 is provided inside the holding portion 140, and the vibration portion 120 and the holding portion 140 form a space with a predetermined gap. The vibration portion 120 has a base section 130 and four vibration arms 135A to 135D (hereinafter collectively referred to as "vibration arms 135") in an example illustrated in FIG. 3. Note that the number of vibration arms is not limited to four, and is set to be any number of one or more, for example. The vibration arms 135A to 135D and the base section 130 are integrally formed in the present embodiment.

The base section 130 has long sides 131a and 131b in an X axis direction, and short sides 131c and 131d in a Y axis direction in a plan view. The long side 131a is one side of a front end surface of the base section 130 (hereinafter also referred to as "front end 131A"), and the long side 131b is one side of a rear end surface of the base section 130 (hereinafter referred to as "rear end 131B"). The front end 131A and the rear end 131B are provided so as to face each other in the base section 130.

The base section 130 is connected to the vibration arms 135 at the front end 131A, and is connected to the holding arm 110, which will be described later, at the rear end 131B. Note that the shape of the base section 130 is substantially rectangular in a plan view in the example illustrated in FIG. 3, but is not limited thereto. The base section 130 needs to be formed substantially plane-symmetric with respect to a virtual plane P defined along a perpendicular bisector of the long side 131a. For example, the base section 130 may have a trapezoidal shape whose long side 131b is shorter than 131a, or may have a semi-circular shape whose diameter is the long side 131a. Further, each surface of the base section 130 is not limited to a flat surface, and may be a curved surface. The virtual plane P is a flat plane that passes through a center of the vibration portion 120 in a direction in which the vibration arms 135 are aligned.

The base section 130 has a base section length of about 35 μm which is the longest distance between the front end 131A and the rear end 131B in a direction from the front end 131A toward the rear end 131B. In addition, the base section width which is the longest distance between side ends of the base section 130 is about 265 μm. The base section width is in a width direction orthogonal to the base section length direction.

The vibration arms 135 extend in the Y axis direction and have the same size as each other. Each of the vibration arms 135 is provided between the base section 130 and the holding portion 140 in parallel to the Y axis direction, and one end thereof is connected to the front end 131A of the base section 130 to be a fixed end, while the other end thereof is an open end. Further, the vibration arms 135 are provided in parallel to each other at a predetermined interval in the X axis direction. The vibration arm 135 has a width of about 50 μm in the X axis direction and a length of about 465 μm in the Y axis direction, for example.

A portion about 150 μm from the open end, for example, of each of the vibration arms 135 is wider than the other portions of each of the vibration arms 135 in the X axis direction width. A portion having a wider width is referred to as a weight portion G. The weight portion G has a wider width by 10 μm in the right and left along the X axis direction relative to the other portions of each of the vibration arms 135, and has a width of about 70 μm in the X axis direction, for example. The weight portion G is integrally formed with the vibration arms 135 by the same process. By forming the weight portion G, the weight per unit length is heavier at the open end side than at the fixed end side in the vibration arms 135. Accordingly, since each of the vibration arms 135 has the weight portion G at the open end side, it is possible to increase the amplitude of vibration in the up-down direction in each vibration arm.

A protection film 235, which will be described later, is formed on the front surface (surface facing upper lid 30) of the vibration portion 120 so as to cover the entire front surface thereof. Further, a frequency adjustment film 236 is formed on the surface of the protection film 235 at the open end side tip of the vibration arms 135A to 135D, respectively. The resonant frequency of the vibration portion 120 may be adjusted by the protection film 235 and the frequency adjustment film 236.

A substantially entire front surface of the resonator 10 (surface of the side facing the upper lid 30) is covered with the protection film 235 in the present embodiment. Further, a substantially entire surface of the protection film 235 is covered with a parasitic capacitance reduction film 240. Note that it is sufficient that the protection film 235 covers at least the vibration arms 135, and it is not limited to a configuration in which the protection film 235 covers substantially the entire front surface of the resonator 10.

Figure 4:
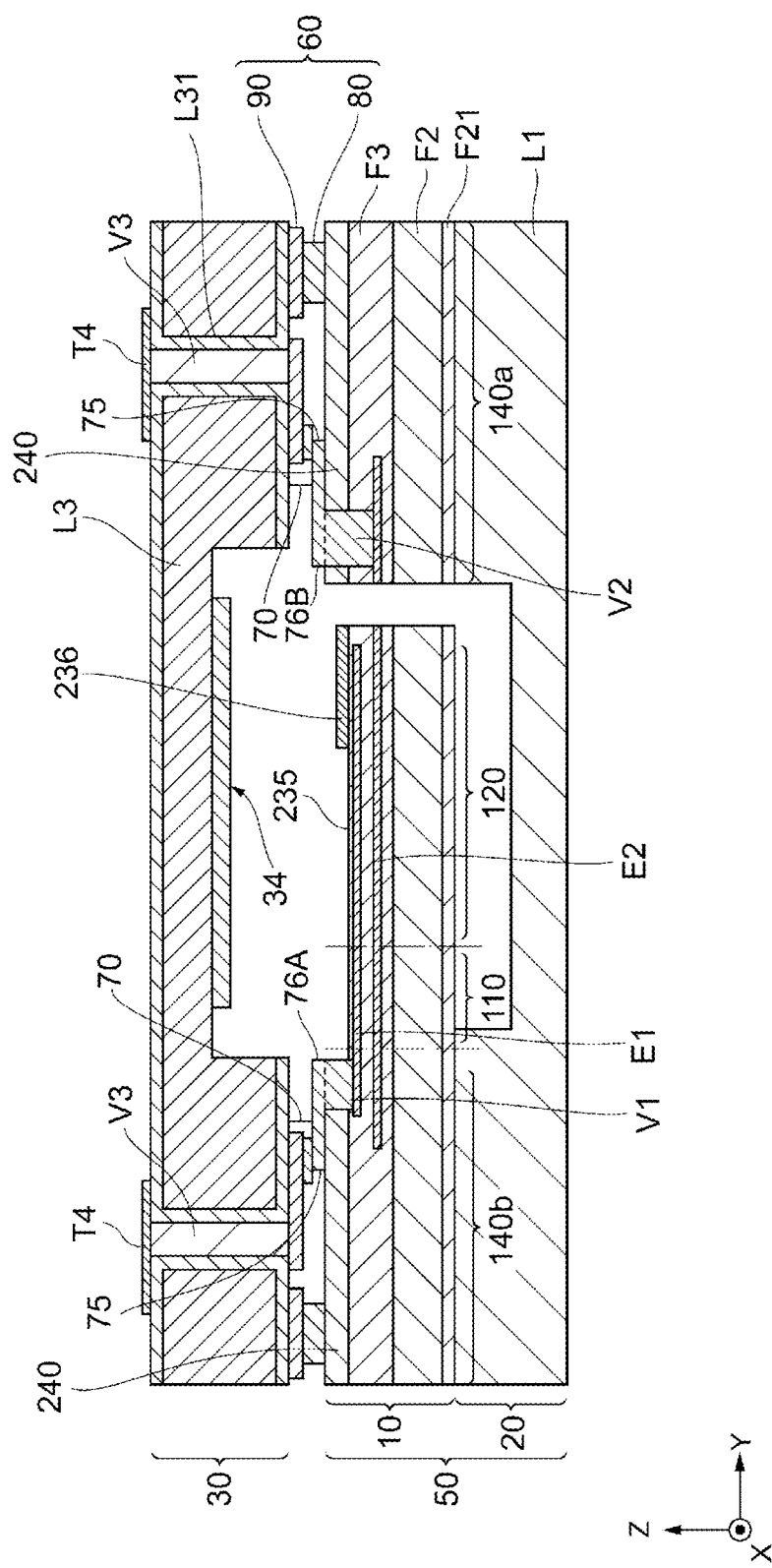
FIG. 4 is a sectional view of the resonance device in FIG. 1 to FIG. 3 schematically illustrating a configuration of a section taken along line IV-IV.

Next, a laminating structure of the resonance device 1 according to an embodiment of the present invention will be described with reference to FIG. 4. FIG. 4 is a sectional view of the resonance device 1 in FIG. 1 to FIG. 3 schematically illustrating a configuration of a section taken along line IV-IV.

As illustrated in FIG. 4, the holding portion 140 of the resonator 10 is bonded on the side wall 23 of the lower lid 20, and the holding portion 140 of the resonator 10 and the side wall 33 of the upper lid 30 are bonded to each other in the resonance device 1. The resonator 10 is held between the lower lid 20 and the upper lid 30 as described above, and a vibration space in which the vibration arms 135 vibrate is formed by the lower lid 20, the upper lid 30, and the holding portion 140 of the resonator 10. Further, a terminal T4 is formed on the upper surface of the upper lid 30 (the opposite side surface of the surface facing the resonator 10). The terminal T4 and the resonator 10 are electrically connected to each other by a through-electrode V3, connection wiring 70, and contact electrodes 76A and 76B.

The upper lid 30 is formed of a silicon (Si) wafer (hereinafter referred to as "Si wafer") L3 having a predetermined thickness. The upper lid 30 is bonded to the holding portion 140 of the resonator 10 by the bonding portion 60, which will be described later, at the peripheral portion thereof (side wall 33). The front surface of the upper lid 30 facing the resonator 10, the rear surface of the upper lid 30, and the side surface of the through-electrode V3 are preferably covered by a silicon oxide film L31. The silicon oxide film L31 is formed on the surface of the Si wafer L3 by oxidation of the surface of the Si wafer L3 or chemical vapor deposition (CVD), for example.

Further, the getter layer 34 is formed on the surface of the recess 31 of the upper lid 30 facing the resonator 10. The getter layer 34 is formed of titanium (Ti), for example, and absorbs an outgas generated in the vibration space. Since the getter layer 34 is formed on the substantially entire surface of the recess 31 facing the resonator 10 in the upper lid 30 according to the present embodiment, it is possible to suppress a fall in the degree of vacuum in the vibration space.

Further, the through-electrode V3 of the upper lid 30 is formed by filling the through-hole formed in the upper lid 30 with a conductive material. The conductive material to be filled with is impurity-doped polycrystalline silicon (Poly-Si), copper (Cu), gold (Au), impurity-doped single crystal silicon, or the like, for example. The through-electrode V3 serves as wiring for electrically connecting the terminal T4 and a voltage applying portion 141 to each other.

The bottom plate 22 and the side wall 23 of the lower lid 20 are integrally formed by a Si wafer L1. Further, the lower lid 20 is bonded to the holding portion 140 of the resonator 10 at the upper surface of the side wall 23. The thickness of the lower lid 20 defined in the Z axis direction is 150 μm, for example, and the depth of the recess 21 is 50 μm, for example. The Si wafer L1 is formed of non-degenerate silicon and the resistivity thereof is equal to or greater than 16 mΩ·cm, for example.

The holding portion 140, the base section 130, the vibration arms 135, and the holding arm 110, all of which constitute the resonator 10, are integrally formed in the same process. The resonator 10 has a piezoelectric thin film F3 formed to cover a silicon (Si) substrate F2 and a metal layer E2 is laminated on the piezoelectric thin film F3. The silicon (Si) substrate F2 is an example of the substrate, and hereinafter is referred to as "Si substrate". Then, the piezoelectric thin film F3 is laminated on the metal layer E2 so as to cover the metal layer E2, and a metal layer E1 is further laminated on the piezoelectric thin film F3. The protection film 235 is laminated on the metal layer E1 so as to cover the metal layer E1, and the parasitic capacitance reduction film 240 is laminated on the protection film 235.

The Si substrate F2 is formed of a degenerated n-type silicon (Si) semiconductor having a thickness of about 6 μm, for example, and may include phosphorus (P), arsenic (As), antimony (Sb), or the like as an n-type dopant. The resistance value of the degenerated silicon (Si) used for the Si substrate F2 is less than 16 mΩ·cm, for example, and is more preferably equal to or less than 1.2 mΩ·cm. Further, a silicon oxide (for example, $SiO_2$) layer F21 is formed on the lower surface of the Si substrate F2 as an example of a temperature characteristic correction layer. This makes it possible to improve the temperature characteristics. Note that the silicon oxide layer F21 may be formed on the upper surface of the Si substrate F2, or may be formed on both the upper surface and the lower surface of the Si substrate F2.

The metal layers E1 and E2 have a thickness of about 0.1 µm to 0.2 µm, for example, and are patterned into a desired shape by etching or the like after the film formation. As the metal layers E1 and E2, metals having a crystal structure with a body-centered cubic structure are used. Specifically, the metal layers E1 and E2 are formed by using molybdenum (Mo), tungsten (W), or the like.

The metal layer E1 is formed to serve as an upper electrode in the vibration portion 120, for example. Further, the metal layer E1 is formed to serve as wiring for connecting the upper electrode to an AC power supply provided outside the resonator 10, in the holding arm 110 and the holding portion 140.

The metal layer E2, on the other hand, is formed to serve as a lower electrode in the vibration portion 120. Further, the metal layer E2 is formed in the holding arm 110 and the holding portion 140 so as to serve as wiring for connecting the lower electrode to a circuit provided outside the resonator 10.

The piezoelectric thin film F3 is made of a piezoelectric thin film and converts an applied voltage into vibrations. The piezoelectric thin film F3 is formed of a material having a crystal structure of a wurtzite hexagonal structure, and a nitride or an oxide such as aluminum nitride (AlN), scandium aluminum nitride (ScAlN), zinc oxide (ZnO), gallium nitride (GaN), indium nitride (InN), or the like may be used as a main component thereof, for example. Scandium aluminum nitride is made by substituting scandium for part of aluminum in aluminum nitride, and the two elements such as magnesium (Mg) and niobium (Nb), or magnesium (Mg) and zirconium (Zr) instead of scandium may be substituted for the part of aluminum. In addition, the piezoelectric thin film F3 has a thickness of 1 µm, for example, but it is also possible to have a thickness of about 0.2 µm to 2 µm.

The piezoelectric thin film F3 expands and contracts in the in-plane direction of the XY plane, that is, in the Y axis direction, in accordance with the electric field applied to the piezoelectric thin film F3 through the metal layers E1 and E2. Because of the expansion and contraction of the piezoelectric thin film F3, the vibration arm 135 displaces its free end toward the inner surfaces of the lower lid 20 and the upper lid 30, and vibrates in the out-of-plane bending vibration mode.

The phases of the electric fields applied to the outer side vibration arms 135A and 135D and the phases of the electric fields applied to the inner side vibration arms 135B and 135C are set to be opposite to each other in the present embodiment. With this, the outer side vibration arms 135A and 135D, and the inner side vibration arms 135B and 135C displace in opposite directions to each other. For example, when the free ends of the outer side vibration arms 135A and 135D displace toward the inner surface of the upper lid 30, the free ends of the inner side vibration arms 135B and 135C displace toward the inner surface of the lower lid 20.

The protection film 235 prevents oxidation of the metal layer E1, which is an upper electrode for piezoelectric vibration. It is preferable that the protection film 235 be formed of a material having a lower mass reduction speed of etching than that of the frequency adjustment film 236. The mass reduction speed is represented by an etching speed, that is, a product of a thickness to be removed per unit time and the density. The protection film 235 is formed of a piezoelectric film such as aluminum nitride (AlN), scandium aluminum nitride (ScAlN), zinc oxide (ZnO), gallium nitride (GaN), indium nitride (InN), or the like, or an insulation film such as silicon nitride (SiN), silicon oxide ($SiO_2$), alumina oxide ($Al_2O_3$), or the like, for example. The thickness of the protection film 235 is about 0.2 µm, for example.

The frequency adjustment film 236 is formed on the substantially entire surface of the vibration portion 120 first, and then formed only in a predetermined region by a process such as etching. The frequency adjustment film 236 is formed of a material having a higher mass reduction speed of etching than that of the protection film 235. Specifically, the frequency adjustment film 236 is made of a metal such as molybdenum (Mo), tungsten (W), gold (Au), platinum (Pt), nickel (Ni), titanium (Ti), or the like.

Note that, when the relationship between the mass reduction speeds is as described above, any magnitude relationship between the etching speeds of the protection film 235 and the frequency adjustment film 236 is acceptable.

The parasitic capacitance reduction film 240 is formed of tetraethyl orthosilicate (TEOS). The parasitic capacitance reduction film 240 has a thickness of about 1 µm. The parasitic capacitance reduction film 240 reduces a parasitic capacitance in the routing wiring portion and has a function as an insulation layer when wiring lines with different potential cross, and a function as a standoff for widening the vibration space.

The connection wiring 70 is electrically connected to the terminal T4 via the through-electrode V3, and is also electrically connected to the contact electrodes 76A and 76B.

The contact electrode 76A is formed so as to be in contact with the metal layer E1 of the resonator 10, and electrically connects the connection wiring 70 and the resonator 10. The contact electrode 76B is formed so as to be in contact with the metal layer E2 of the resonator 10, and electrically connects the connection wiring 70 and the resonator 10 to each other. Specifically, when the contact electrode 76A and the metal layer E1 are connected to each other, part of the piezoelectric thin film F3, the protection film 235, and the parasitic capacitance reduction film 240 laminated on the metal layer E1 is removed so that the metal layer E1 is exposed, and a via V1 is formed. The formed via V1 is filled with a material similar to that of the contact electrode 76A, and the metal layer E1 and the contact electrode 76A are connected to each other. Similarly, when the contact electrode 76B and the metal layer E2 are connected to each other, part of the piezoelectric thin film F3 and the parasitic capacitance reduction film 240 laminated on the metal layer E2 is removed so that the metal layer E2 is exposed, and a via V2 is formed. The formed via V2 is filled with a material similar to that of the contact electrode 76B, and the metal layer E2 and the contact electrode 76B are connected to each other. The contact electrodes 76A and 76B are made of a metal such as aluminum (Al), gold (Au), tin (Sn), or the like, for example. Note that the connection point between the metal layer E1 and the contact electrode 76A and the connection point between the metal layer E2 and the contact electrode 76B are preferably in regions outside the vibration portion 120, and are present in the holding portion 140 in the present embodiment.

The bonding portion 60 is formed in a rectangular frame shape along the XY plane between the MEMS substrate 50 (resonator 10 and lower lid 20) and the upper lid 30 on the periphery of the vibration portion 120 of the resonator 10, i.e., on the holding portion 140. The bonding portion 60 bonds the MEMS substrate 50 and the upper lid 30 to each other so as to seal the vibration space of the resonator 10. With this, the vibration space is hermetically sealed, and the vacuum state is maintained.

In the present embodiment, the bonding portion 60 includes a first layer 80 formed on the MEMS substrate 50 and a second layer 90 formed on the upper lid 30, and the MEMS substrate 50 and the upper lid 30 are bonded by eutectic bonding of the first layer 80 and the second layer 90.

Figure 5:
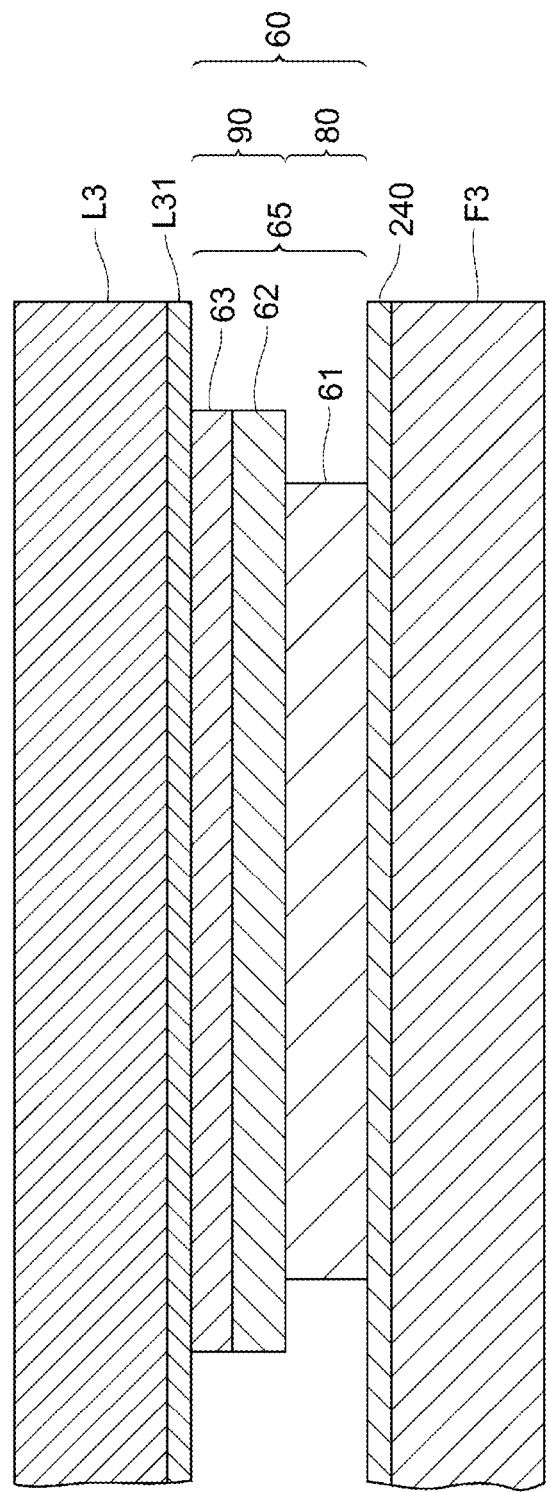
FIG. 5 is an enlarged sectional view of a main portion of a bonding portion in FIG. 4 schematically illustrating the configuration thereof.

Next, a laminating structure of the bonding portion 60 according to an embodiment of the present invention will be described with reference to FIG. 5. FIG. 5 is an enlarged sectional view of a main portion of the bonding portion 60 in FIG. 4 schematically illustrating the configuration thereof.

The bonding portion 60 includes a eutectic layer 65 containing a eutectic alloy as a main component thereof as illustrated in FIG. 5. The eutectic layer 65 includes a eutectic alloy of a first metal layer 61, a second metal layer 62, and a third metal layer 63 as a main component thereof. The first metal layer 61 is a layer of a first metal containing aluminum (Al) as a main component thereof, the second metal layer 62 is a layer of a second metal of germanium (Ge) or silicon (Si), and the third metal layer 63 is a layer of a third metal of titanium (Ti) or nickel (Ni).

The first metal layer 61 of the bonding portion 60 is included in the first layer 80. On the other hand, the second metal layer 62 and the third metal layer 63 are included in the second layer 90.

Each of the first metal layer 61, the second metal layer 62 and the third metal layer 63 is described as an independent layer, but in practice, the interfaces of the layers are eutectic bondings in the example illustrated in FIG. 5. That is, the eutectic layer 65 contains a eutectic alloy as a main component thereof. The eutectic alloy is composed of the first metal containing aluminum (Al) as a main component thereof, the second metal of germanium (Ge) or silicon (Si), and the third metal of titanium (Ti) or nickel (Ni).

In the following description, unless otherwise specified, the first metal of the first metal layer 61 is aluminum (Al), the second metal of the second metal layer 62 is germanium (Ge), the third metal of the third metal layer 63 is titanium (Ti), and the eutectic layer 65 contains an aluminum-germanium-titanium alloy (AlGeTi alloy) as a main component thereof. In this case, the eutectic layer 65 may include aluminum (Al), germanium (Ge), aluminum-titanium (AlTi), germanium-titanium (GeTi), and aluminum-germanium (AlGe) in addition to the aluminum-germanium-titanium alloy (AlGeTi alloy).

The first metal of the first metal layer 61 is preferably aluminum (Al), an aluminum-copper alloy (AlCu alloy), or an aluminum-silicon-copper alloy (AlSiCu alloy). Aluminum or an aluminum alloy is a metal often used in wiring, for example, in such as a resonance device. Thus, using aluminum (Al), an aluminum-copper alloy (AlCu alloy), or an aluminum-silicon-copper alloy (AlSiCu alloy) as the first metal of the first metal layer 61 allows an easy eutectic bonding with the second metal of the second metal layer 62 and the third metal of the third metal layer 63, simplifying of the manufacturing process, and easy formation of the bonding portion 60 to seal the vibration space of the resonator 10.

As described in the background section hereinabove, when two elements, for example, aluminum (Al) and germanium (Ge) are bonded by a eutectic reaction, an aluminum-germanium alloy (AlGe alloy) is hardly formed, and an aluminum (Al) monolayer and a germanium (Ge) monolayer are formed. As a result, a large number of interfaces between the aluminum (Al) monolayer and the germanium (Ge) monolayer are present. At the interfaces of the different materials, voids or separation (interfacial separation) is likely to occur because of a difference in thermal stresses, and airtightness and bonding strength of the bonding portion are deteriorated in some cases.

Figure 6:
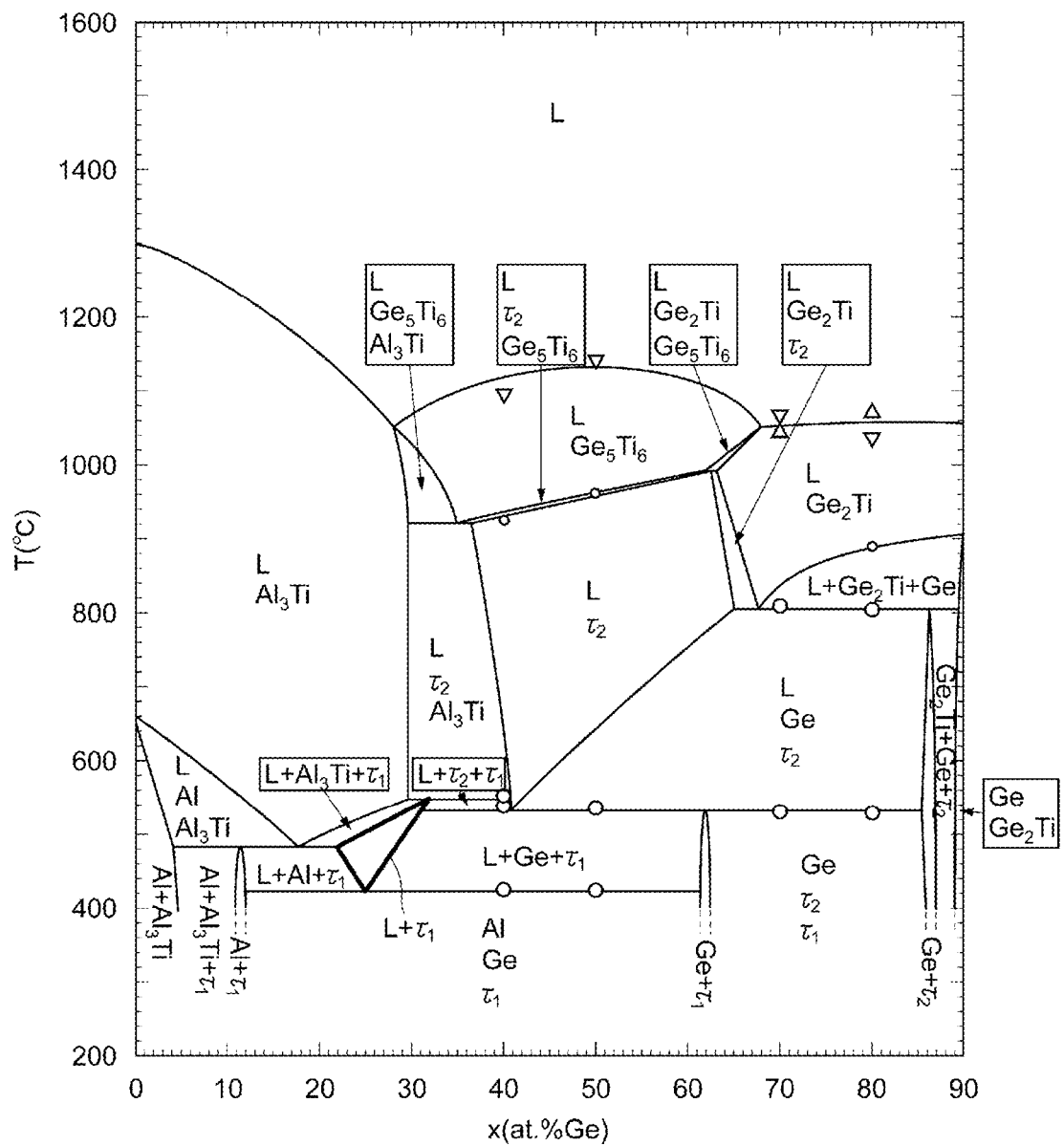
FIG. 6 is a diagram describing a state in which three elements of aluminum (Al), germanium (Ge), and titanium (Ti) are subjected to a eutectic reaction.

Next, a state of the bonding portion 60 according to an embodiment of the present invention will be described with reference to FIG. 6. FIG. 6 is a diagram describing a state in which three elements of aluminum (Al), germanium (Ge), and titanium (Ti) are subjected to a eutectic reaction. In FIG. 6, the horizontal axis represents the ratio (at %) of germanium (Ge), and the vertical axis represents the temperature (° C.).

On the other hand, when the three elements, for example, aluminum (Al), germanium (Ge), and titanium (Ti) are bonded by a eutectic reaction, a liquid of a eutectic molten metal (denoted by L in FIG. 6) and an aluminum-germanium-titanium alloy (AlGeTi alloy, denoted by T1 in FIG. 6) are generated in the area surrounded by the bold line illustrated in FIG. 6. Similarly, a liquid of a eutectic molten metal and an alloy are generated when the aluminum (Al), germanium (Ge), and nickel (Ni) are subjected to a eutectic reaction, when aluminum (Al), silicon (Si), and titanium (Ti) are subjected to a eutectic reaction, and when aluminum (Al), silicon (Si) and nickel (Ni) are subjected to a eutectic reaction. As described above, in a certain eutectic reaction of three elements, an alloy is formed and interfaces of different materials are not formed.

Thus, the formation of interfaces of different materials in the bonding portion 60 is suppressed when the bonding portion 60 includes the eutectic layer 65 containing a eutectic alloy as a main component thereof. The eutectic alloy is composed of the first metal layer 61 containing aluminum (Al) as a main component thereof, the second metal layer 62 of germanium (Ge) or silicon (Si), and the third metal layer 63 of titanium (Ti) or nickel (Ni). Accordingly, voids or interfacial separation that may occur in the bonding portion 60 are reduced, and the airtightness and the bonding strength of the bonding portion 60 may be improved.

In addition, the solid alloy is formed together with a liquid of a eutectic molten metal at the eutectic point or higher when forming the eutectic layer 65 as described above, and thus, the fluidity of the eutectic molten metal is reduced and the splash of the eutectic molten metal in a planar direction is suppressed. Accordingly, a short circuit due to the splash of the bonding portion 60 may be reduced and the degree of freedom in layout of the resonance device 1 may be improved.

Each element of the eutectic layer 65 preferably has a predetermined concentration ratio. For example, when the eutectic layer 65 contains an aluminum-germanium-titanium alloy (AlGeTi alloy) as a main component thereof, it is preferable that, in the eutectic layer 65, the concentration of aluminum (Al) be 58 at % to 82 at %, the concentration of germanium (Ge) be 10 at % to 32 at %, and the concentration of titanium (Ti) be 7 at % to 32 at %. Accordingly, the bonding portion 60 having improved airtightness and bonding strength may be easily achieved.

In addition, it is preferable that each of the elements in the eutectic layer 65 have a predetermined concentration ratio. For example, when the eutectic layer 65 contains an aluminum-germanium-titanium alloy (AlGeTi alloy) as a main component thereof, it is preferable that the concentration ratio of aluminum (Al), germanium (Ge), and titanium (Ti) in the eutectic layer 65 be 3 to 1 to 1. This further suppresses the formation of interfaces of different materials in the bonding portion 60.

Figure 7:
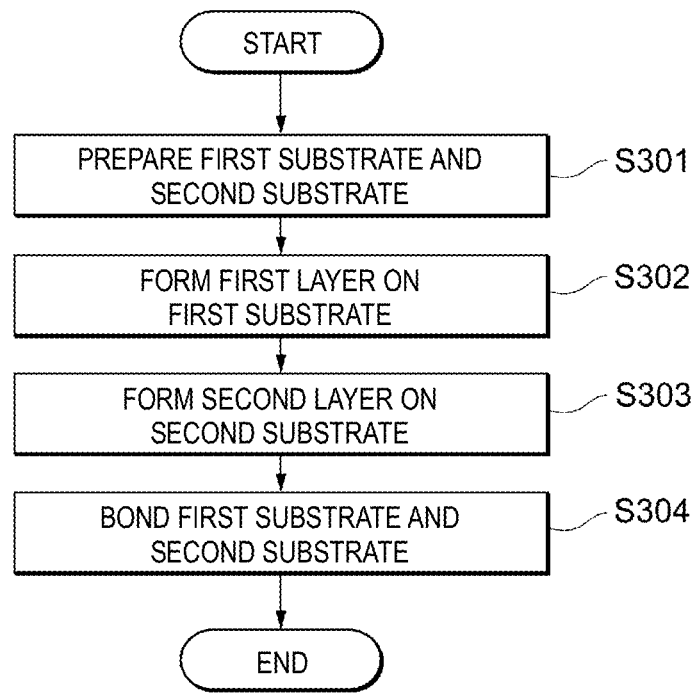
FIG. 7 is a flowchart describing a manufacturing method of the resonance device according to an embodiment of the present invention.
Figure 9:
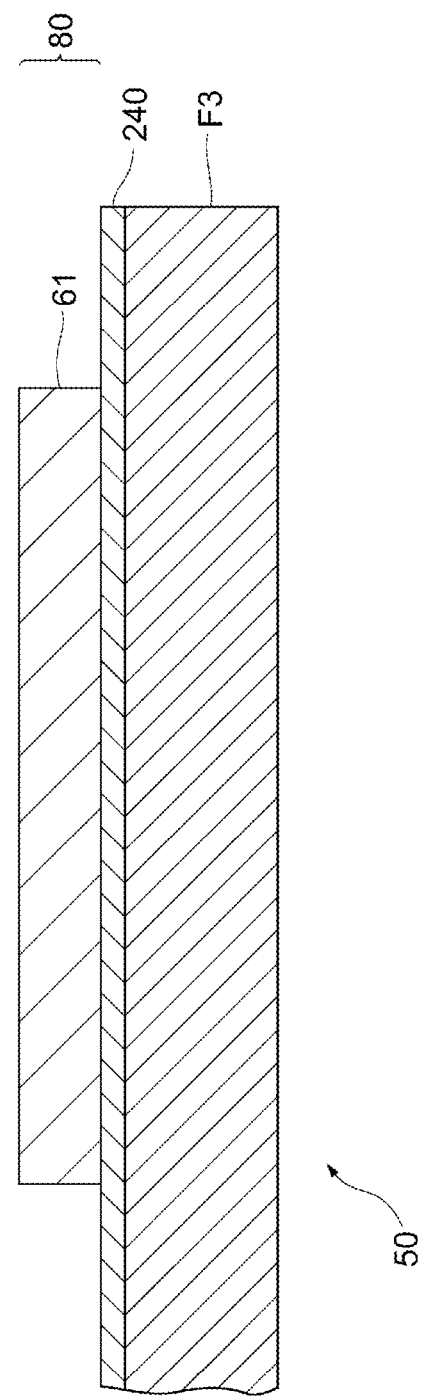
FIG. 9 is a sectional view of a process described in FIG. 7.
Figure 10:
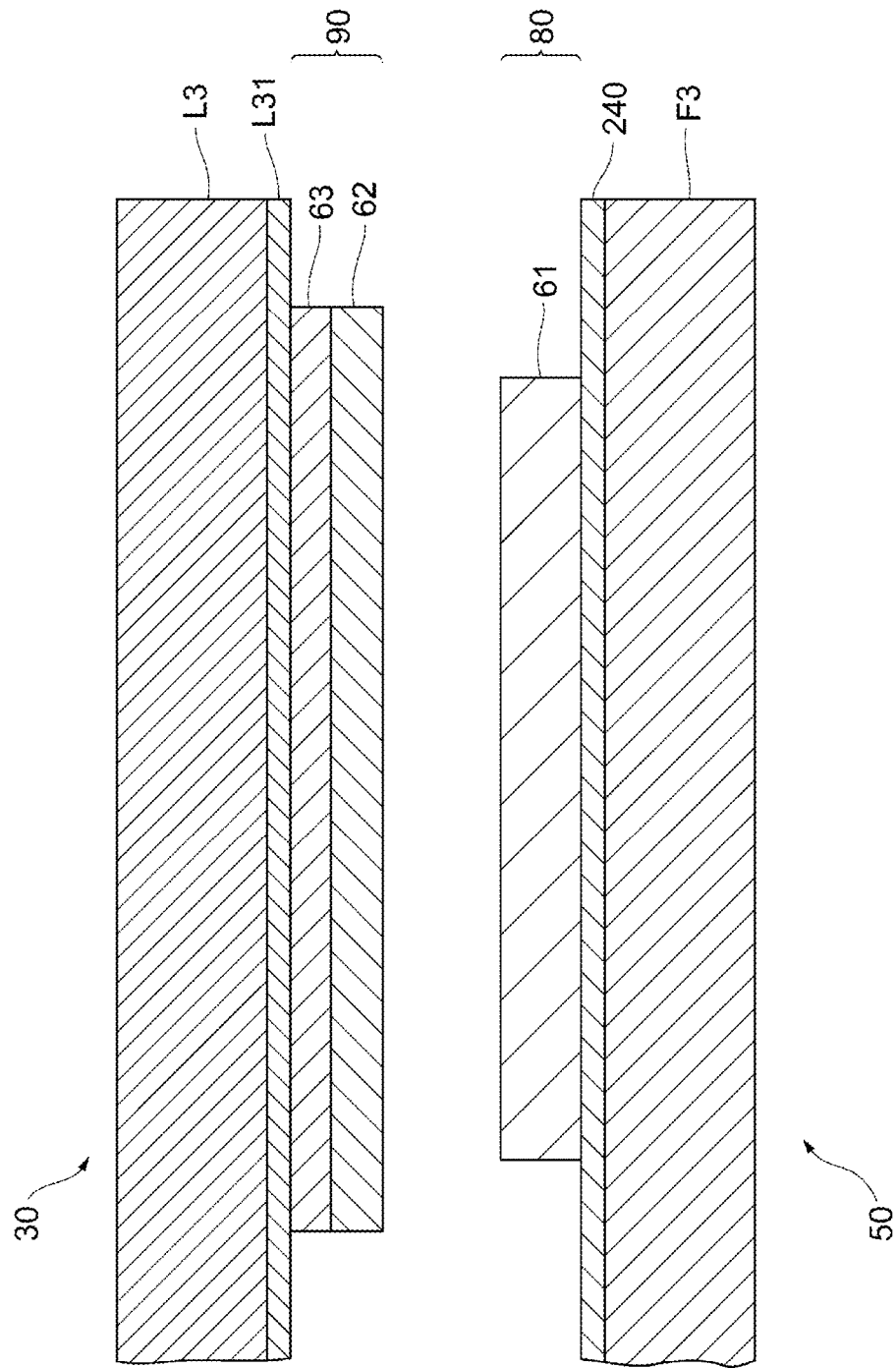
FIG. 10 is a sectional view of a process described in FIG. 7.
Figure 11:
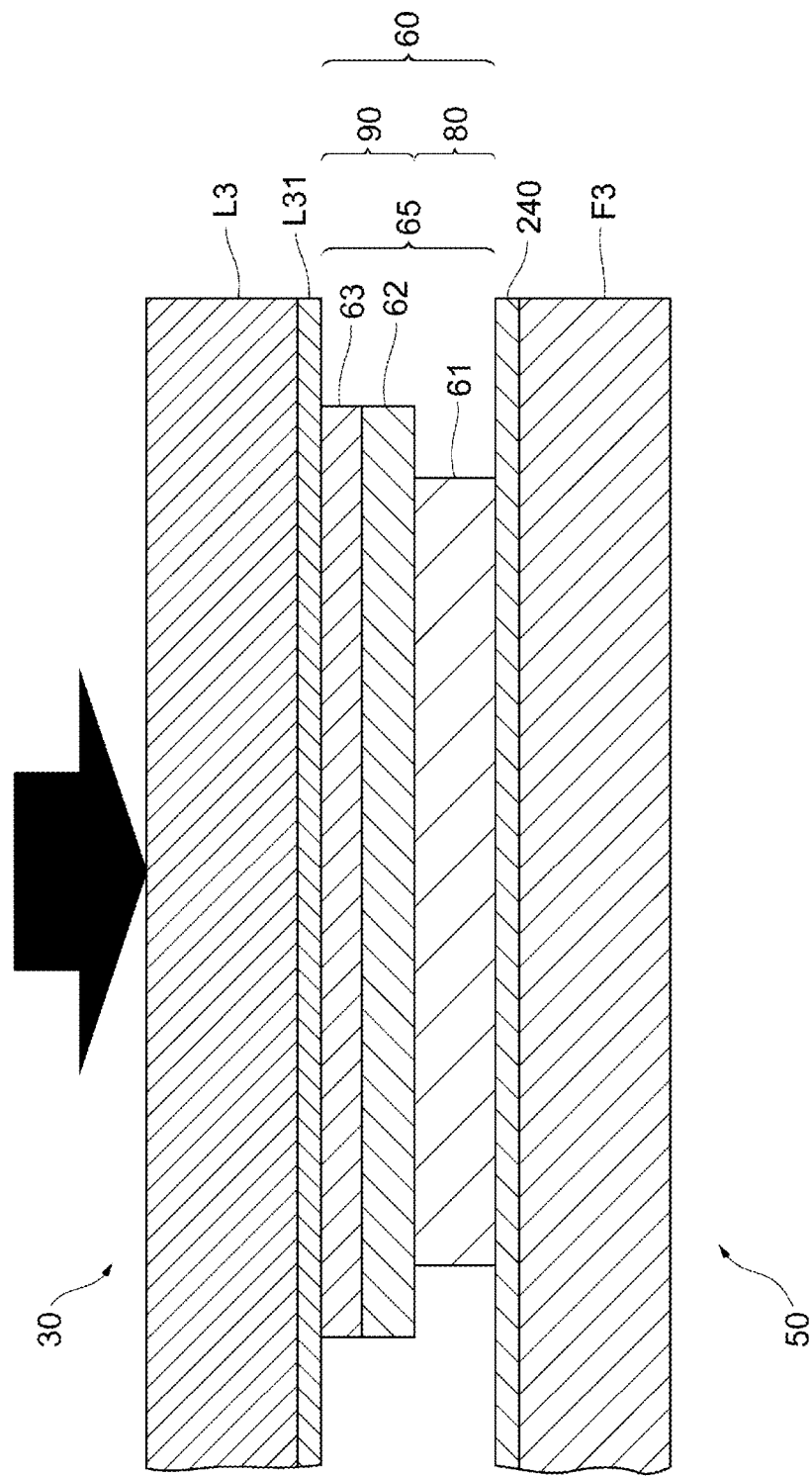
FIG. 11 is a sectional view of a process described in FIG. 7.

Next, a manufacturing method of a resonance device according to an embodiment of the present invention will be described with reference to FIG. 7 to FIG. 11. FIG. 7 is a flowchart describing a manufacturing method of the resonance device 1 according to an embodiment of the present invention. FIG. 8 is a sectional view of step S301 in FIG. 7. FIG. 9 is a sectional view of step S302 in FIG. 7. FIG. 10 is a sectional view of step S303 in FIG. 7. FIG. 11 is a sectional view of step S304 in FIG. 7. Note that, while a plurality of resonance devices 1 is manufactured in the manufacturing method, one resonance device 1 will be described in FIG. 8 to FIG. 11, for convenience.

As illustrated in FIG. 7, the MEMS substrate 50 and the upper lid 30 are prepared first (S301). Specifically, as illustrated in FIG. 8, the MEMS substrate 50 including the resonator 10 and the upper lid 30 having the through-electrode V3, which are described above, are prepared. However, the connection wiring 70 to connect the through-electrode V3 and the resonator 10 to each other, which is illustrated in FIG. 4, is not yet formed.

Referring back to FIG. 7, next, in the MEMS substrate 50 prepared in step S301, the first layer 80 including the first metal layer 61 containing aluminum (Al) as a main component is formed around the vibration portion 120 of the resonator 10 (S302).

Specifically, aluminum (Al), for example, is laminated on the parasitic capacitance reduction film 240 formed on the piezoelectric thin film F3 of the prepared MEMS substrate 50 (resonator 10) as illustrated in FIG. 9. Next, the first metal layer 61 is formed on the outer side of the vibration portion 120 in the MEMS substrate 50 by forming the laminated aluminum (Al) into a desired shape by etching or the like. The first metal layer 61 is formed around the resonance space of the resonator 10 when the MEMS substrate 50 is viewed in a plan view.

After the first layer 80 is formed, heat treatment for degassing may be performed to the MEMS substrate 50 at a high temperature, for example, at about 435° C. Since the first layer 80 includes only the first metal layer 61, the influence of the thermal diffusion is small even when the heat treatment is performed at a high temperature.

Referring back to FIG. 7, next, the second layer 90 is formed in the upper lid 30 prepared in step S301 (S303). The second layer 90 includes the second metal layer 62 of germanium (Ge) and the third metal layer 63 of titanium (Ti) that extend continuously from the side of the MEMS substrate 50 when the MEMS substrate 50 and the upper lid 30 face each other.

Specifically, titanium (Ti), for example, is laminated on the surface of the silicon oxide film L31 on the rear surface of the upper lid 30 as illustrated in FIG. 10. Next, the third metal layer 63 is formed at a predetermined position of the upper lid 30 by forming the laminated titanium (Ti) into a desired shape by etching or the like. The predetermined position at which the third metal layer 63 is formed is, for example, a position on the rear surface of the upper lid 30 facing or substantially facing the first layer 80 formed on the MEMS substrate 50 when the front surface of the MEMS substrate 50 and the rear surface of the upper lid 30 face each other. Then, germanium (Ge), for example, is laminated on the third metal layer 63 (under the third metal layer 63 in FIG. 10) to provide the second metal layer 62.

After the second layer 90 is formed, the heat treatment for degassing the upper lid 30 may be performed at a high temperature, for example, at about 435° C. With this, the gas contained in the upper lid 30 and the second layer 90 may sufficiently be released (evaporated), and the generation of outgas may be reduced.

Referring back to FIG. 7, next, the MEMS substrate 50 on which the first layer 80 is formed in step S302 and the upper lid 30 on which the second layer 90 is formed in step S303 are bonded to each other so as to seal the vibration space of the resonator 10 (S304). Step S304 includes forming the bonding portion 60 including the eutectic layer 65 containing a eutectic alloy as a main component thereof. The eutectic alloy is composed of the first metal containing aluminum (Al) as a main component thereof, the second metal of germanium (Ge) or silicon (Si), and the third metal of titanium (Ti) or nickel (Ni).

Specifically, the positions of the MEMS substrate 50 and the upper lid 30 are aligned so that the first layer 80 and the second layer 90 coincide with each other. After the alignment, the MEMS substrate 50 and the upper lid 30 are sandwiched by a heater or the like, and the heat treatment for the eutectic reaction of three elements is performed. At this time, the upper lid 30 is moved toward the MEMS substrate 50. As a result, the second metal layer 62 of the second layer 90 is in contact with the first metal layer 61 of the first layer 80 as illustrated in FIG. 11.

The temperature in the heat treatment for the eutectic reaction of three elements is preferably equal to or lower than the eutectic point temperature, and lower than the melting point in the case of aluminum (Al) alone as the first metal. That is, when the second metal is germanium (Ge) and the third metal is titanium (Ti), it is preferable that the temperature in the heat treatment be equal to or higher than 422° C. that is the eutectic point, and lower than about 620° C. that is the melting point of aluminum (Al) alone. When the second metal is germanium (Ge) and the third metal is nickel (Ni), it is preferable that the temperature in the heat treatment be equal to or higher than 423±2° C. that is the eutectic point (eutectic point changes depending on the proportion (%) of each metal), and lower than about 620° C. that is the melting point of aluminum (Al) alone as the first metal. When the second metal is silicon (Si) and the third metal is titanium (Ti), it is preferable that the temperature in the heat treatment be equal to or higher than 577° C. that is the eutectic point and lower than about 620° C. that is the melting point of aluminum (Al) alone as the first metal. Further, when the second metal is silicon (Si) and the third metal is nickel (Ni), it is preferable that the temperature in the heat treatment be equal to or higher than 567° C. or 568° C. that is the eutectic point (eutectic point differs depending on the ratio (%) of each metal), and lower than about 620° C. that is the melting point of aluminum (Al) alone as the first metal.

The heating duration is preferably about equal to or more than 5 minutes and equal to or less than 30 minutes. In the present embodiment, the heat treatment is performed at the temperature of about 440° C. and with the heating duration of about 15 minutes.

During heating, the upper lid 30 and the MEMS substrate 50 are pressed from the upper lid 30 to the MEMS substrate 50 as indicated by the black arrow in FIG. 11. The pressure to be pressed is about 15 Mpa, for example, and is preferably about 5 MPa to 25 MPa.

Further, after the heat treatment for the eutectic reaction of three elements, the cooling treatment is performed by natural cooling, for example. The cooling treatment is required to form the eutectic layer 65 containing a eutectic alloy as a main component in the bonding portion 60, and is not limited to the natural cooling. The cooling temperature and the cooling rate of the cooling treatment may be variously selected.

As a result of performing step S304 in FIG. 7, the bonding portion 60 including the eutectic layer 65 containing a eutectic alloy of the first metal, the second metal, and the third metal as a main component is formed as illustrated in FIG. 5.

The connection wiring 70 illustrated in FIG. 4 for connecting the through-electrode V3 and the resonator 10 to each other may be provided by the eutectic bonding of an aluminum (Al) film formed at the time of forming the first layer 80 and a germanium (Ge) film formed at the time of forming the second layer 90.

In the present embodiment, examples in which the bonding portion 60 includes only the eutectic layer 65 containing a eutectic alloy of the first metal, the second metal, and the third metal as a main component are illustrated in FIG. 5 to FIG. 11, however, the present invention is not limited to the examples. For example, the bonding portion 60 may include a layer other than the eutectic layer 65.

First Modification

Figure 12:
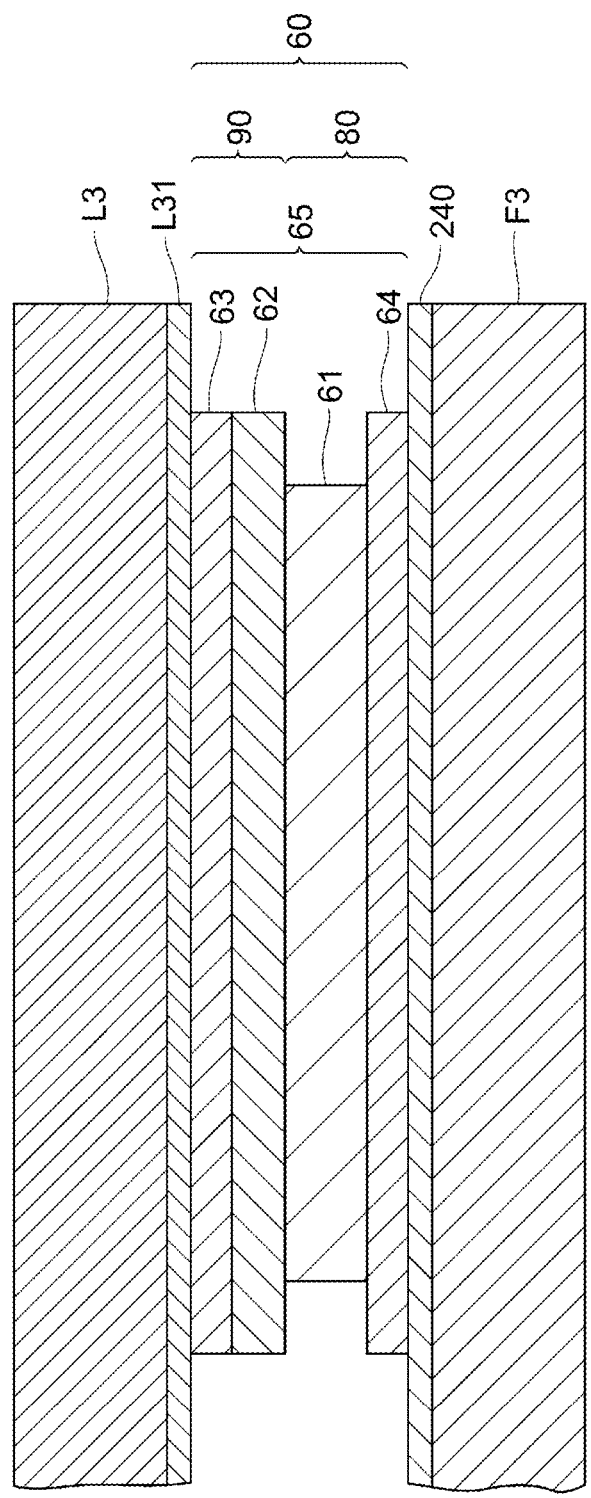
FIG. 12 is an enlarged sectional view of a main portion illustrating a first modification of the bonding portion in FIG. 5.

FIG. 12 is an enlarged sectional view of a main portion illustrating a first modification of the bonding portion 60 in FIG. 5. Note that in the first modification, the same configurations as those of the bonding portion 60 illustrated in FIG. 5 are denoted by the same reference symbols, and the description thereof will be omitted as appropriate. Further, similar actions and effects achieved by the similar configuration will not repeatedly be described.

The third metal of the third metal layer 63 is titanium (Ti), and the eutectic layer 65 of the bonding portion 60 includes a titanium (Ti) layer 64 in addition to the first metal layer 61, the second metal layer 62, and the third metal layer 63 as illustrated in FIG. 12. The titanium (Ti) layer 64 is included in the first layer 80, and extends continuously from the side of the MEMS substrate 50 to the first metal layer 61.

The titanium (Ti) layer 64 is made of titanium (Ti). The titanium (Ti) layer 64 functions as an adhesion layer for bringing the eutectic layer 65 into close contact. Since the first layer 80 includes the titanium (Ti) layer 64 extending continuously from the side of the MEMS substrate 50 to the first metal layer 61, the adhesion between the bonding portion 60 and the MEMS substrate 50 is improved. Accordingly, the bonding strength of the bonding portion 60 may further be improved.

In the manufacturing method according to the first modification, the titanium (Ti) layer 64 extends continuously from the side of the MEMS substrate 50 to the first metal layer 61 in step S302 described in FIG. 9.

Specifically, the titanium (Ti) layer 64 is provided by laminating titanium (Ti) on the parasitic capacitance reduction film 240 formed on the piezoelectric thin film F3. Next, aluminum (Al), for example, is laminated on the titanium (Ti) layer 64. The laminated aluminum (Al) is formed into a desired shape by etching or the like, whereby the first metal layer 61 is formed.

The eutectic layer 65 containing a eutectic alloy of the first metal, titanium (Ti) of the titanium (Ti) layer 64, the second metal, and titanium (Ti) of the third metal as a main component is formed in step S304 described in FIG. 11. The heat treatment for the eutectic reaction of three elements is the same as that in the example described above.

Second Modification

Figure 13:
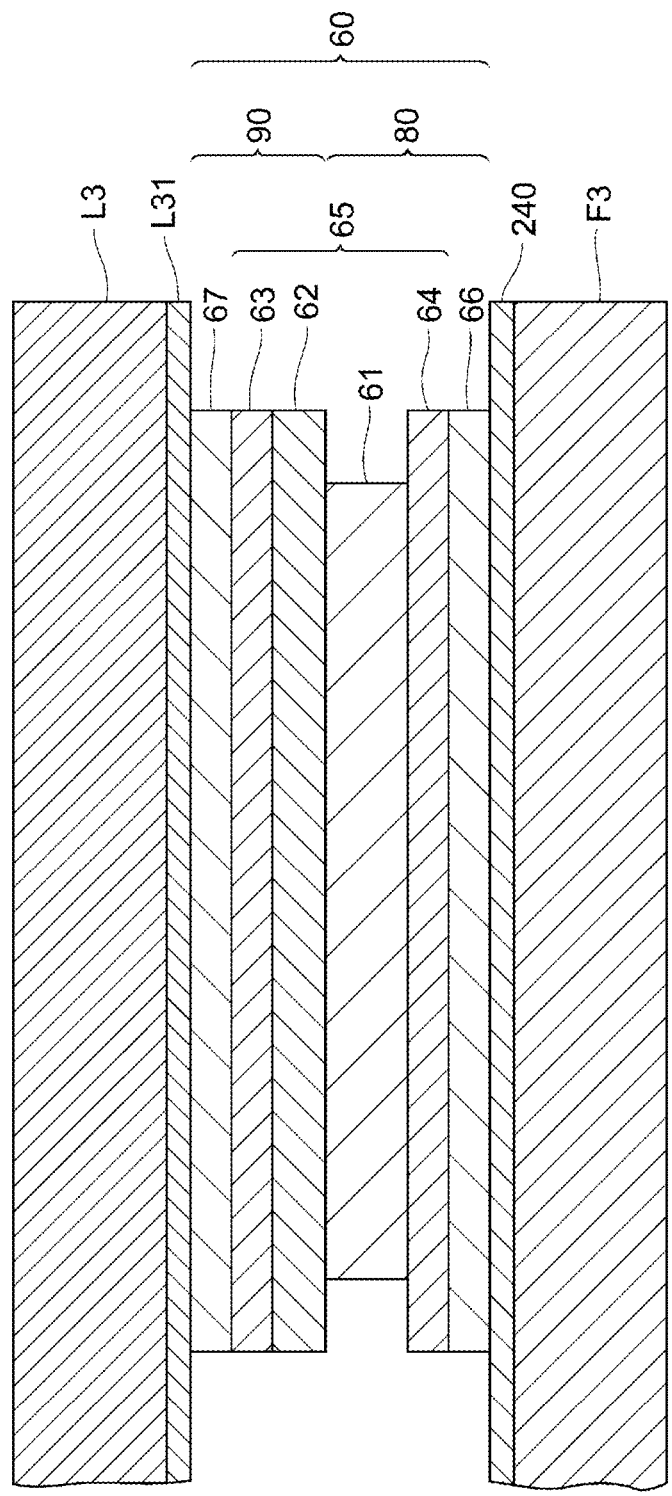
FIG. 13 is an enlarged sectional view of a main portion illustrating a second modification of the bonding portion in FIG. 5.

FIG. 13 is an enlarged sectional view of a main portion illustrating a second modification of the bonding portion 60 in FIG. 5. Note that in the second modification, the same configurations as those of the bonding portion 60 illustrated in FIG. 5 are denoted by the same reference symbols, and the description thereof will be omitted as appropriate. Further, similar actions and effects achieved by the similar configuration will not repeatedly be described.

As illustrated in FIG. 13, the third metal of the third metal layer 63 is titanium (Ti), and the bonding portion 60 further includes a first conductive layer 66 extending continuously from the side of the MEMS substrate 50 to the eutectic layer 65, and a second conductive layer 67 extending continuously from the side of the upper lid 30 to the eutectic layer 65. Note that, the eutectic layer 65 includes the titanium (Ti) layer 64 as same as in the first modification.

The first conductive layer 66 is included in the first layer 80, and the second conductive layer 67 is included in the second layer 90. The first conductive layer 66 and the second conductive layer 67 contain aluminum (Al) as a main component thereof. As described above, the bonding portion 60 further includes the first conductive layer 66 containing aluminum (Al) as a main component thereof, which extends continuously from the side of the MEMS substrate 50 to the eutectic layer 65, and the second conductive layer 67 containing aluminum (Al) as a main component thereof, which extends continuously from the side of the upper lid 30 to the eutectic layer 65. This enables the wiring to be routed from the first conductive layer 66 in the MEMS substrate 50 and also enables the wiring to be routed from the second conductive layer 67 in the upper lid 30.

Further, the material of the first conductive layer 66 and the second conductive layer 67 each is preferably aluminum (Al), an aluminum-copper alloy (AlCu alloy), or an aluminum-silicon-copper alloy (AlSiCu alloy). This allows the first conductive layer 66 and the second conductive layer 67 to have conductivity, the manufacturing process to be simplified, and the bonding portion 60 that seals the vibration space of the resonator 10 to be easily formed.

In the manufacturing method of the second modification, the first conductive layer 66 and the titanium (Ti) layer 64 extend continuously from the side of the MEMS substrate 50 to the first metal layer 61 in step S302 described in FIG. 9.

Specifically, aluminum (Al), for example, is laminated on the parasitic capacitance reduction film 240 formed on the piezoelectric thin film F3. The laminated aluminum (Al) is formed into a desired shape by etching or the like, whereby the first conductive layer 66 is formed. Titanium (Ti) is laminated on the first conductive layer 66 to provide the titanium (Ti) layer 64. Next, aluminum (Al), for example, is laminated on the titanium (Ti) layer 64. Then the laminated aluminum (Al) is formed into a desired shape by etching or the like, whereby the first metal layer 61 is formed.

The second conductive layer 67 extends continuously from the side of the upper lid 30 to the eutectic layer 65 in step S303 described in FIG. 10.

Specifically, aluminum (Al), for example, is laminated on the surface of the silicon oxide film L31. The laminated aluminum (Al) is formed into a desired shape by etching or the like, whereby the second conductive layer 67 is formed. Titanium (Ti) is laminated on the second conductive layer 67 (under the second conductive layer 67 in FIG. 13). Next, the laminated titanium (Ti) is formed into a desired shape by etching or the like, whereby the third metal layer 63 is formed. Then, germanium (Ge), for example, is laminated on the third metal layer 63 (under the third metal layer 63 in FIG. 13) to provide the second metal layer 62.

Further, similarly to the first modification, the eutectic layer 65 containing a eutectic alloy of the first metal, titanium (Ti) of the titanium (Ti) layer 64, the second metal, and titanium (Ti) of the third metal as a main component is formed in step S304 described in FIG. 11. The heat treatment for the eutectic reaction of three elements is the same as that in the above-described example.

Third Modification

Figure 14:
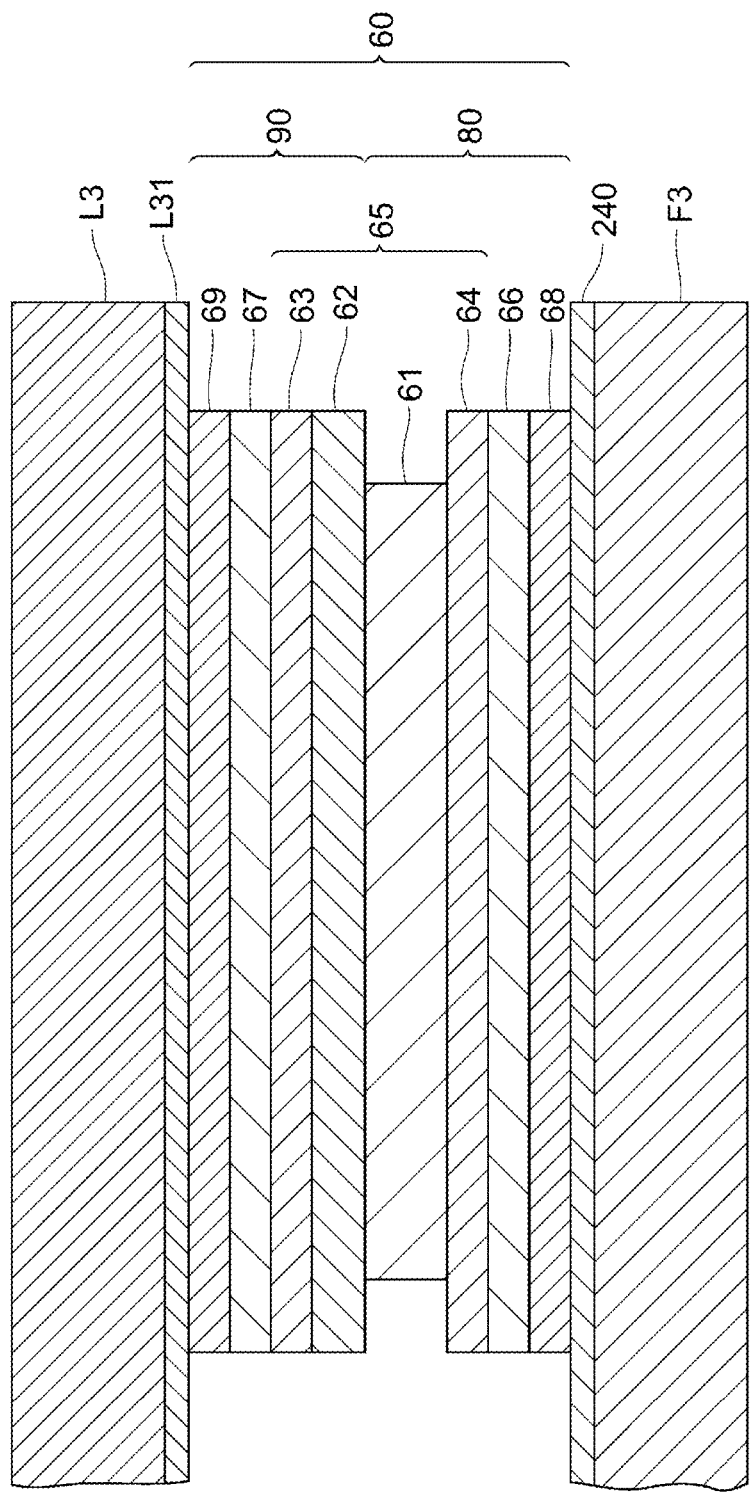
FIG. 14 is an enlarged sectional view of a main portion illustrating a third modification of the bonding portion in FIG. 5.

FIG. 14 is an enlarged sectional view of a main portion illustrating a third modification of the bonding portion 60 in FIG. 5. Note that in the third modification, the same configurations as those of the bonding portion 60 illustrated in FIG. 5 are denoted by the same reference symbols, and the description thereof will be omitted as appropriate. Further, similar actions and effects achieved by the similar configuration will not repeatedly be described.

As illustrated in FIG. 14, the third metal of the third metal layer 63 is titanium (Ti), and the bonding portion 60 further includes a first adhesion layer 68 and the first conductive layer 66 that extend continuously from the side of the MEMS substrate 50 to the eutectic layer 65, and a second adhesion layer 69 and the second conductive layer 67 that extend continuously from the side of the upper lid 30 to the eutectic layer 65. Note that, the eutectic layer 65 includes the titanium (Ti) layer 64 as same as in the first modification.

The first adhesion layer 68 and the first conductive layer 66 are included in the first layer 80, and the second adhesion layer 69 and the second conductive layer 67 are included in the second layer 90. The first conductive layer 66 and the second conductive layer 67 contain aluminum (Al) as a main component thereof.

Further, the material of the first conductive layer 66 and the second conductive layer 67 each is preferably aluminum (Al), an aluminum-copper alloy (AlCu alloy), or an aluminum-silicon-copper alloy (AlSiCu alloy).

The material of the first adhesion layer 68 and the second adhesion layer 69 each is titanium (Ti). The titanium (Ti) layer 64 functions as an adhesion layer for bringing the eutectic layer 65 into close contact. Thus, the bonding portion 60 further includes the first adhesion layer 68 of titanium (Ti) and the first conductive layer 66 that extend continuously from the side of the MEMS substrate 50 to the eutectic layer 65, and the second adhesion layer 69 of titanium (Ti) and the second conductive layer 67 that extend continuously from the side of the upper lid 30 to the eutectic layer 65. This enables the improvement of the adhesion between the bonding portion 60 and the MEMS substrate 50, and the adhesion between the bonding portion 60 and the upper lid 30. Accordingly, the bonding strength of the bonding portion 60 may further be improved.

In the manufacturing method of the third modification, the first adhesion layer 68, the first conductive layer 66 and the titanium (Ti) layer 64 extend continuously from the side of the MEMS substrate 50 to the first metal layer 61 in step S302 described in FIG. 9.

Specifically, the first adhesion layer 68 is provided by laminating titanium (Ti) on the parasitic capacitance reduction film 240 formed on the piezoelectric thin film F3. Next, aluminum (Al), for example, is laminated on the first adhesion layer 68. The laminated aluminum (Al) is formed into a desired shape by etching or the like, whereby the first conductive layer 66 is formed. Titanium (Ti) is laminated on the first conductive layer 66 to provide the titanium (Ti) layer 64. Next, aluminum (Al), for example, is laminated on the titanium (Ti) layer 64. The laminated aluminum (Al) is formed into a desired shape by etching or the like, whereby the first metal layer 61 is formed.

Further, the second adhesion layer 69 and the second conductive layer 67 extend continuously from the side of the upper lid 30 to the eutectic layer 65 in step S303 described in FIG. 10.

Specifically, the second adhesion layer 69 is provided by laminating titanium on the surface of the silicon oxide film L31. Next, aluminum (Al), for example, is laminated on the second adhesion layer 69 (under the second adhesion layer 69 in FIG. 14). The laminated aluminum (Al) is formed into a desired shape by etching or the like, whereby the second conductive layer 67 is formed. Titanium (Ti) is laminated on the second conductive layer 67 (under the second conductive layer 67 in FIG. 14). Next, the laminated titanium (Ti) is formed into a desired shape by etching or the like, whereby the third metal layer 63 is formed. Then, germanium (Ge), for example, is laminated on the third metal layer 63 (under the third metal layer 63 in FIG. 14) to provide the second metal layer 62.

Further, similarly to the first modification and the second modification, the eutectic layer 65 containing a eutectic alloy of the first metal, titanium (Ti) of the titanium (Ti) layer 64, the second metal, and the titanium (Ti) of the third metal as a main component is formed in step S304 described in FIG. 11. The heat treatment for the eutectic reaction of three elements is the same as that in the above-described example.

The exemplary embodiments of the present invention have been described above. In the resonance device according to an embodiment of the present invention, a bonding portion includes a eutectic layer containing a eutectic alloy as a main component thereof. The eutectic alloy is composed of a first metal containing aluminum (Al) as a main component thereof, a second metal of germanium (Ge) or silicon (Si), and a third metal of titanium (Ti) or nickel (Ni). This suppresses formation of interfaces of different materials in the bonding portion. Accordingly, voids or interfacial separation that may occur in the bonding portion are reduced, and the airtightness and the bonding strength of the bonding portion may be improved. In addition, the solid alloy is formed together with the liquid of eutectic molten metal at the eutectic point or higher when forming the eutectic layer as described above, and thus, the fluidity of the eutectic molten metal is reduced and the splash of the eutectic molten metal in a planar direction is suppressed. Accordingly, a short circuit due to the splash of the bonding portion may be reduced and the degree of freedom in layout of the resonance device may be improved.

In the resonance device described above, the eutectic layer contains an aluminum-germanium-titanium alloy (AlGeTi alloy) as a main component thereof, and the concentration of aluminum (Al) is 58 at % to 82 at %, the concentration of germanium (Ge) is 10 at % to 32 at %, and the concentration of titanium (Ti) is 7 at % to 32 at %. With this, the bonding portion having improved airtightness and bonding strength may be easily achieved.

In the resonance device described above, the eutectic layer contains an aluminum-germanium-titanium alloy (AlGeTi alloy) as a main component thereof, and the concentration ratio of aluminum (Al), germanium (Ge), and titanium (Ti) is 3 to 1 to 1. This further suppresses the formation of interfaces of different materials in the bonding portion.

In the resonance device described above, the first metal is aluminum (Al), an aluminum-copper alloy (AlCu alloy), or an aluminum-silicon-copper alloy (AlSiCu alloy). Aluminum or an aluminum alloy is a metal often used in wiring, for example, in such as a resonance device. Thus, using aluminum (Al), an aluminum-copper alloy (AlCu alloy), or an aluminum-silicon-copper alloy (AlSiCu alloy) as a first metal allows easy eutectic bonding with a second metal and a third metal, simplifying of the manufacturing process, and easy formation of a bonding portion to seal a vibration space of a resonator.

In addition, in the resonance device described above, the bonding portion further includes a first conductive layer containing aluminum (Al) as a main component thereof, which extends continuously from a side of a first substrate to the eutectic layer, and a second conductive layer containing aluminum (Al) as a main component thereof, which extends continuously from a side of a second substrate to the eutectic layer. This enables a wiring to be routed from the first conductive layer in the first substrate and also enables wiring to be routed from the second conductive layer in the second substrate.

In the resonance device described above, the bonding portion further includes a first adhesion layer of titanium (Ti) and the first conductive layer that extend continuously from a side of the first substrate to the eutectic layer, and a second adhesion layer of titanium (Ti) and the second conductive layer that extend continuously from a side of the second substrate to the eutectic layer. This improves the adhesion between the bonding portion and the first substrate, and the adhesion between the bonding portion and the second substrate. Accordingly, the bonding strength of the bonding portion may further be improved.

In the resonance device described above, a material of the first conductive layer and the second conductive layer each is aluminum (Al), an aluminum-copper alloy (AlCu alloy), or an aluminum-silicon-copper alloy (AlSiCu alloy). This allows the first conductive layer and the second conductive layer to have conductivity, the manufacturing process to be simplified, and the bonding portion that seals the vibration space of the resonator to be easily formed.

In the manufacturing method of a resonance device according to an embodiment of the present invention, the bonding step forms a bonding portion including a eutectic layer containing a eutectic alloy as a main component thereof. The eutectic alloy is composed of a first metal containing aluminum (Al) as a main component thereof, a second metal of germanium (Ge) or silicon (Si), and a third metal of titanium (Ti) or nickel (Ni). This suppresses formation of interfaces of different materials in the bonding portion. Accordingly, voids or interfacial separation that may occur in the bonding portion are reduced, and the airtightness and the bonding strength of the bonding portion may be improved. In addition, the solid alloy is formed together with the liquid of eutectic molten metal at the eutectic point or higher when forming the eutectic layer as described above, and thus, the fluidity of the eutectic molten metal is reduced and the splash of the eutectic molten metal in a planar direction is suppressed. Accordingly, a short circuit due to the splash of the bonding portion may be reduced and the degree of freedom in layout of the resonance device may be improved.

In the above-described manufacturing method of a resonance device, the first metal is aluminum (Al), an aluminum-copper alloy (AlCu alloy), or an aluminum-silicon-copper alloy (AlSiCu alloy). Aluminum or an aluminum alloy is a metal often used in wiring, for example, in such as a resonance device. Thus, using aluminum (Al), an aluminum-copper alloy (AlCu alloy), or an aluminum-silicon-copper alloy (AlSiCu alloy) as a first metal allows easy eutectic bonding with a second metal and a third metal, simplifying of the manufacturing process, and easy formation of a bonding portion to seal a vibration space of a resonator.

In addition, in the above-described manufacturing method of a resonance device, the step of forming the first layer includes providing a titanium (Ti) layer that extends continuously from a side of the first substrate to the first metal layer. This improves the adhesion between the bonding portion and the MEMS substrate. Accordingly, the bonding strength of the bonding portion may further be improved.

In the above-described manufacturing method of a resonance device, the step of forming the first layer includes providing the first conductive layer containing aluminum (Al) as a main component and the titanium layer that extend continuously from a side of the first substrate to the eutectic layer, and the step of forming the second layer includes providing the second conductive layer containing aluminum (Al) as a main component that extends continuously from a side of the second substrate to the eutectic layer. This enables the wiring to be routed from the first conductive layer in the first substrate and also enables the wiring to be routed from the second conductive layer in the second substrate.

In addition, in the above-described manufacturing method of a resonance device, the step of forming the first layer includes providing the first adhesion layer of titanium (Ti), the first conductive layer, and the titanium layer that extend continuously from a side of the first substrate to the eutectic layer, and the step of forming the second layer includes providing the second adhesion layer of titanium (Ti) and the second conductive layer that extend continuously from a side of the second substrate to the eutectic layer. This improves the adhesion between the bonding portion and the first substrate, and the adhesion between the bonding portion and the second substrate. Accordingly, the bonding strength of the bonding portion may further be improved.

In the above-described manufacturing method of a resonance device, a material of the first conductive layer and the second conductive layer each is aluminum (Al), an aluminum-copper alloy (AlCu alloy), or an aluminum-silicon-copper alloy (AlSiCu alloy). This allows the first conductive layer and the second conductive layer to have conductivity, the manufacturing process to be simplified, and the bonding portion that seals the vibration space of the resonator to be easily formed.

The embodiments described above are intended to facilitate understanding of the present invention, and are not intended to limit the present invention. The present invention may be modified and/or improved without departing from the spirit and scope of the invention, and the present invention includes its equivalents. That is, products achieved by design change on the aforementioned embodiments carried out appropriately by those skilled in the art, are also included in the scope of the present invention as long as the products are provided with the features of the present invention. For example, the constituent elements included in the embodiments, and their arrangement, materials, conditions, shapes, sizes and the like are not limited to the exemplified ones, and may be modified as appropriate. It is to be noted that the embodiments are merely illustrative, and it is needless to say that it is possible to partially replace or combine the configurations described in the different embodiments, and that these are also included within the scope of the present invention as long as they include the features of the present invention.

REFERENCE SIGNS LIST

1 RESONANCE DEVICE
10 RESONATOR

20 LOWER LID
21 RECESS
22 BOTTOM PLATE
23 SIDE WALL
30 UPPER LID
31 RECESS
33 SIDE WALL
34 GETTER LAYER
50 MEMS SUBSTRATE
60 BONDING PORTION
61 FIRST METAL LAYER
62 SECOND METAL LAYER
63 THIRD METAL LAYER
64 TITANIUM (Ti) LAYER
65 EUTECTIC LAYER
66 FIRST CONDUCTIVE LAYER
67 SECOND CONDUCTIVE LAYER
68 FIRST ADHESION LAYER
69 SECOND ADHESION LAYER
70 CONNECTION WIRING
76A, 76B CONTACT ELECTRODE
80 FIRST LAYER
90 SECOND LAYER
110 HOLDING ARM
120 VIBRATION PORTION
130 BASE SECTION
131a LONG SIDE
131A FRONT END
131b LONG SIDE
131B REAR END
131c SHORT SIDE
131d SHORT SIDE
135, 135A, 135B, 135C, 135D VIBRATION ARM
140 HOLDING PORTION
141 VOLTAGE APPLYING PORTION
235 PROTECTION FILM
236 FREQUENCY ADJUSTMENT FILM
240 PARASITIC CAPACITANCE REDUCTION FILM
E1, E2 METAL LAYER
F2 Si SUBSTRATE
F3 PIEZOELECTRIC THIN FILM
F21 SILICON OXIDE LAYER
G WEIGHT PORTION
L1 WAFER
L3 Si WAFER
L31 SILICON OXIDE FILM
P VIRTUAL PLANE
T4 TERMINAL
V1, V2 VIA
V3 THROUGH-ELECTRODE

The invention claimed is:

1. A resonance device comprising:
a first substrate including a resonator;
a second substrate; and
a bonding portion bonding the first substrate and the second substrate to each other to seal a vibration space of the resonator,
wherein the bonding portion includes a eutectic layer containing a eutectic alloy as a main component thereof, and the eutectic alloy is an alloy of a first metal containing aluminum as a main component thereof, a second metal of germanium or silicon, and a third metal of titanium or nickel.

2. The resonance device according to claim 1, wherein the eutectic alloy is an aluminum-germanium-titanium alloy.

3. The resonance device according to claim 2, wherein the aluminum-germanium-titanium alloy has a concentration of aluminum of 58 at % to 82 at %, a concentration of germanium of 10 at % to 32 at %, and a concentration of titanium of 7 at % to 32 at %.

4. The resonance device according to claim 2, wherein the aluminum-germanium-titanium alloy has a concentration ratio of aluminum, germanium, and titanium of 3 to 1 to 1.

5. The resonance device according to claim 1, wherein the first metal is any of aluminum, an aluminum-copper alloy, or an aluminum-silicon-copper alloy.

6. The resonance device according to claim 1, wherein the bonding portion further includes:
a first conductive layer extending continuously from a side of the first substrate to the eutectic layer; and
a second conductive layer extending continuously from a side of the second substrate to the eutectic layer, and wherein
the first conductive layer and the second conductive layer contain aluminum as a main component thereof.

7. The resonance device according to claim 6, wherein a material of each of the first conductive layer and the second conductive layer is any of aluminum, an aluminum-copper alloy, or an aluminum-silicon-copper alloy.

8. The resonance device according to claim 1, wherein the bonding portion further includes:
a first adhesion layer and a first conductive layer that extend continuously from a side of the first substrate to the eutectic layer; and
a second adhesion layer and a second conductive layer that extend continuously from a side of the second substrate to the eutectic layer, wherein
the first conductive layer and the second conductive layer contain aluminum as a main component thereof, and
a material of each of the first adhesion layer and the second adhesion layer is titanium.

9. The resonance device according to claim 8, wherein a material of each of the first conductive layer and the second conductive layer is any of aluminum, an aluminum-copper alloy, or an aluminum-silicon-copper alloy.

10. A method of manufacturing a resonance device, the method comprising:
forming a first layer including a first metal layer of a first metal containing aluminum as a main component thereof around a vibration portion of a resonator in a first substrate;
forming a second layer including a second metal layer of a second metal of germanium or silicon and a third metal layer of a third metal of titanium or nickel that extend continuously from a side of the second substrate, at a position facing the first metal layer in the first substrate when the first substrate and the second substrate face each other; and
forming a bonding portion including a eutectic layer containing a eutectic alloy of the first metal, the second metal, and the third metal as a main component thereof so as to bond the first substrate and the second substrate to seal a vibration space of the resonator.

11. The method of manufacturing a resonance device according to claim 10, wherein the first metal is any of aluminum, an aluminum-copper alloy, or an aluminum-silicon-copper alloy.

12. The method of manufacturing a resonance device according to claim 10,
wherein the third metal is titanium,
the forming of the first layer includes providing a titanium layer that extends continuously from a side of the first substrate to the first metal layer, and the eutectic alloy is an alloy of the first metal, titanium in the titanium layer, the second metal, and titanium in the third metal layer as a main component thereof.

13. The method of manufacturing a resonance device according to claim 10,
wherein the third metal is titanium,
the forming of the first layer includes providing a first conductive layer and a titanium layer that extend continuously from a side of the first substrate to the first metal layer,
the forming of the second layer includes providing a second conductive layer that extends continuously from a side of the second substrate to the third metal layer,
the eutectic alloy is an alloy of the first metal, titanium in the titanium layer, the second metal, and titanium in the third metal layer as a main component thereof, and
the first conductive layer and the second conductive layer contain aluminum as a main component thereof.

14. The method of manufacturing a resonance device according to claim 13, wherein a material of each of the first conductive layer and the second conductive layer is any of aluminum, an aluminum-copper alloy, or an aluminum-silicon-copper alloy.

15. The method of manufacturing a resonance device according to claim 10,
wherein the third metal is titanium,
the forming of the first layer includes providing a first adhesion layer, a first conductive layer, and a titanium layer that extend continuously from a side of the first substrate to the first metal layer,
the forming of the second layer includes providing a second adhesion layer and a second conductive layer that extend from a side of the second substrate to the third metal layer,
the eutectic alloy is an alloy of the first metal, titanium in the titanium layer, the second metal, and titanium in the third metal layer as a main component thereof,
the first conductive layer and the second conductive layer contain aluminum as a main component thereof, and
a material of each of the first adhesion layer and the second adhesion layer is titanium.

16. The method of manufacturing a resonance device according to claim 15, wherein a material of each of the first conductive layer and the second conductive layer is any of aluminum, an aluminum-copper alloy, or an aluminum-silicon-copper alloy.

17. The method of manufacturing a resonance device according to claim 11, wherein the eutectic alloy is an aluminum-germanium-titanium alloy.

18. The method of manufacturing a resonance device according to claim 17, wherein the aluminum-germanium-titanium alloy has a concentration of aluminum of 58 at % to 82 at %, a concentration of germanium of 10 at % to 32 at %, and a concentration of titanium of 7 at % to 32 at %.

19. The method of manufacturing a resonance device according to claim 17, wherein the aluminum-germanium-titanium alloy has a concentration ratio of aluminum, germanium, and titanium of 3 to 1 to 1.

* * * * *